(12) United States Patent
Rathsack et al.

(10) Patent No.: US 8,288,174 B1
(45) Date of Patent: Oct. 16, 2012

(54) ELECTROSTATIC POST EXPOSURE BAKE APPARATUS AND METHOD

(75) Inventors: Benjamen M. Rathsack, Austin, TX (US); Brian Head, Austin, TX (US); Steven Scheer, Austin, TX (US)

(73) Assignee: Tokyo Electron Limited (JP)

( * ) Notice: Subject to any disclaimer, the term of this patent is extended or adjusted under 35 U.S.C. 154(b) by 27 days.

(21) Appl. No.: 13/070,723

(22) Filed: Mar. 24, 2011

(51) Int. Cl.
*H01L 21/00* (2006.01)

(52) U.S. Cl. .................. 438/10; 438/5; 438/17; 438/18; 361/234; 257/48; 257/E23.179; 257/E21.521; 257/E21.525; 257/E21.526; 257/E21.528; 257/E21.53

(58) Field of Classification Search .......................... None
See application file for complete search history.

(56) References Cited

U.S. PATENT DOCUMENTS

| | | | |
|---|---|---|---|
| 5,158,861 A | 10/1992 | Tokui et al. | |
| 5,258,266 A | 11/1993 | Tokui et al. | |
| 6,230,651 B1 | 5/2001 | Ni et al. | |
| 6,242,164 B1 | 6/2001 | Choi et al. | |
| 6,686,132 B2 | 2/2004 | Cheng et al. | |
| 6,754,062 B2 | 6/2004 | Logan et al. | |
| 6,841,342 B2 | 1/2005 | Nishi et al. | |
| 6,864,148 B1 | 3/2005 | Hsiao et al. | |
| 7,196,381 B2 | 3/2007 | Hsiao et al. | |
| 7,352,554 B2 | 4/2008 | Lagos | |
| 7,714,406 B2 | 5/2010 | LaFontaine et al. | |
| 7,864,502 B2 * | 1/2011 | Boyd et al. | 361/234 |
| 2001/0010257 A1 | 8/2001 | Ni et al. | |
| 2003/0070620 A1 | 4/2003 | Cooperberg et al. | |
| 2005/0054174 A1 | 3/2005 | Hsiao et al. | |
| 2005/0074706 A1 | 4/2005 | Bristol et al. | |
| 2005/0133828 A1 | 6/2005 | Hsiao et al. | |
| 2008/0192405 A1 | 8/2008 | Purohit | |
| 2009/0109595 A1 * | 4/2009 | Herchen et al. | 361/234 |
| 2010/0041238 A1 | 2/2010 | Cooperberg et al. | |

* cited by examiner

*Primary Examiner* — Charles Garber
*Assistant Examiner* — Yasser Abdelaziez

(57) ABSTRACT

An Electrostatic Post Exposure Bake (EPEB) subsystem comprising an Electrostatic Bake Plate (EBP) configured in a processing chamber in an EPEB subsystem, wherein the EPEB wafer comprises an exposed masking layer having unexposed regions and exposed regions therein and the EPEB wafer is developed using the EBP.

18 Claims, 14 Drawing Sheets

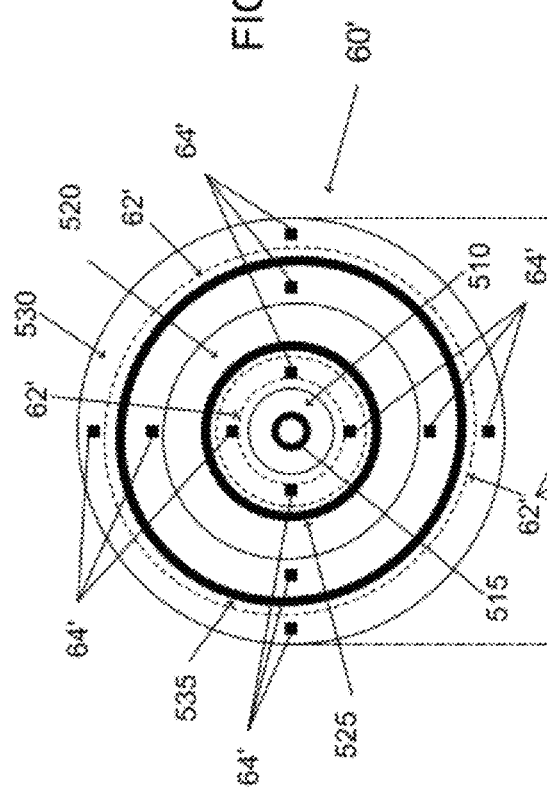
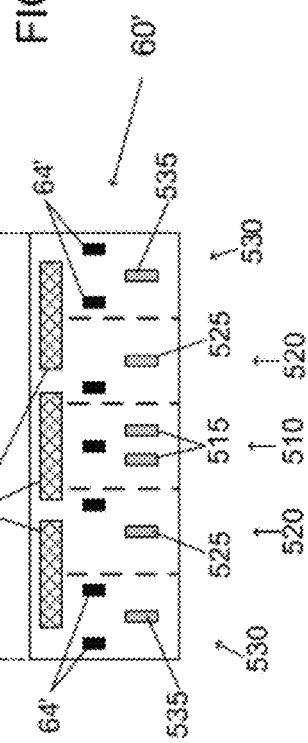
FIG. 5A
FIG. 5B

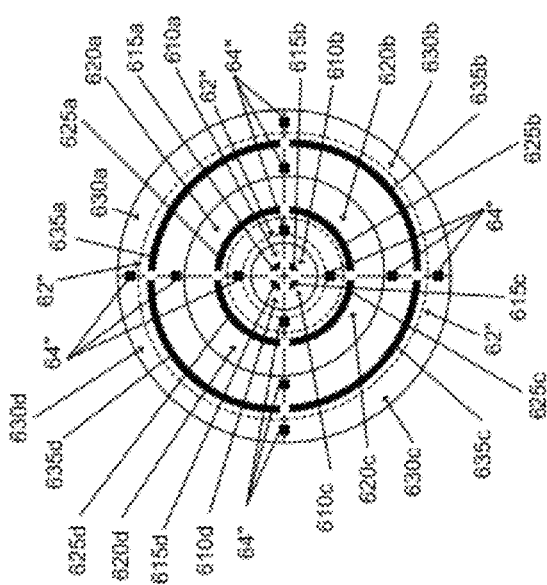
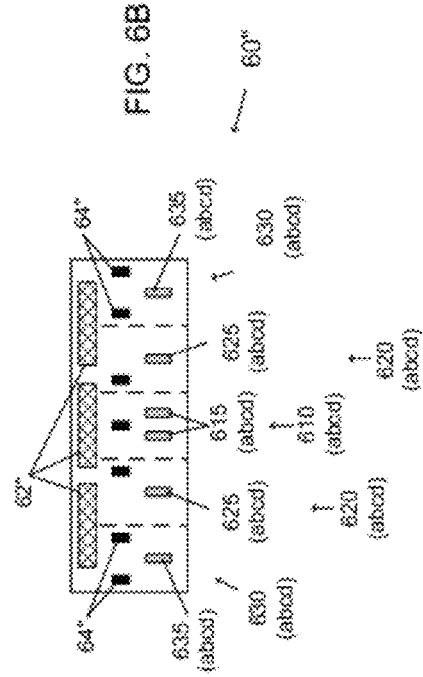

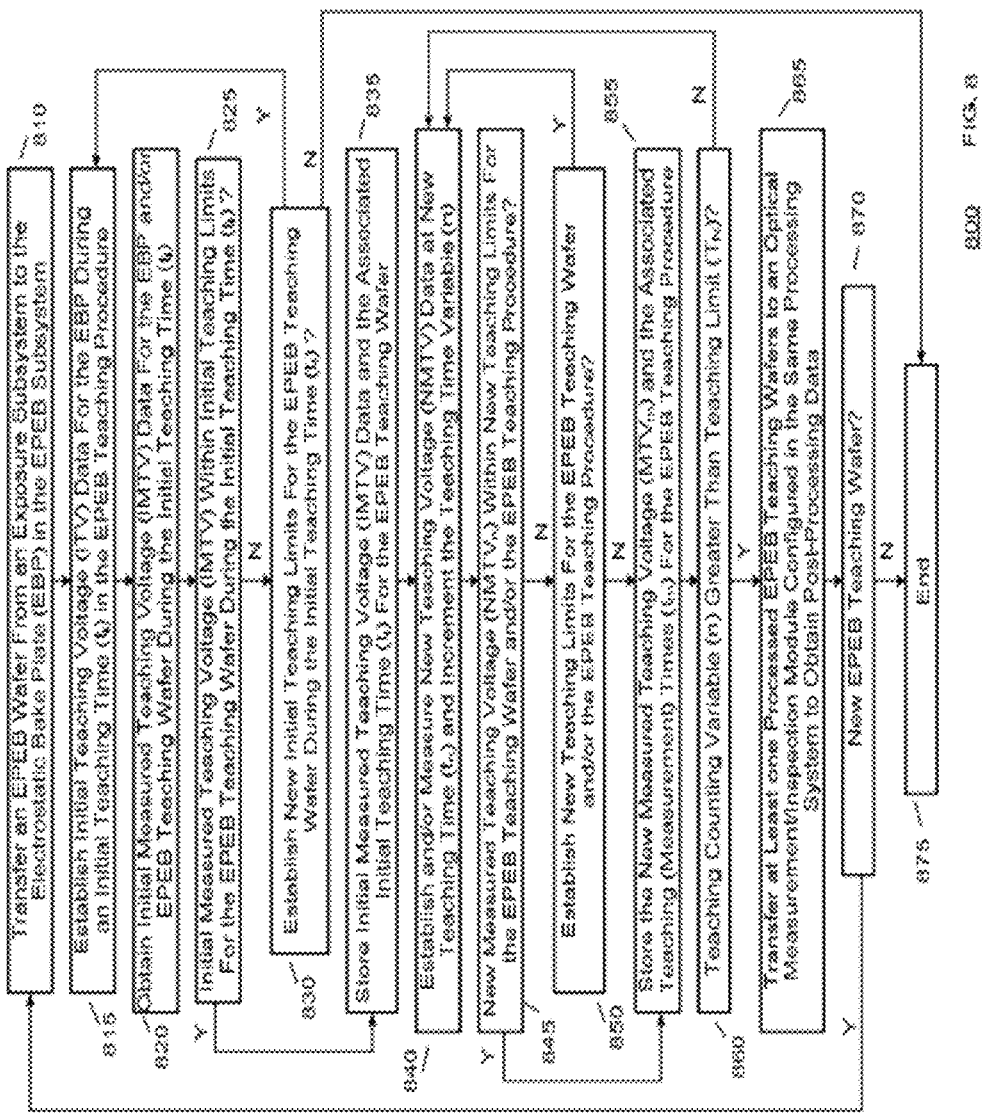

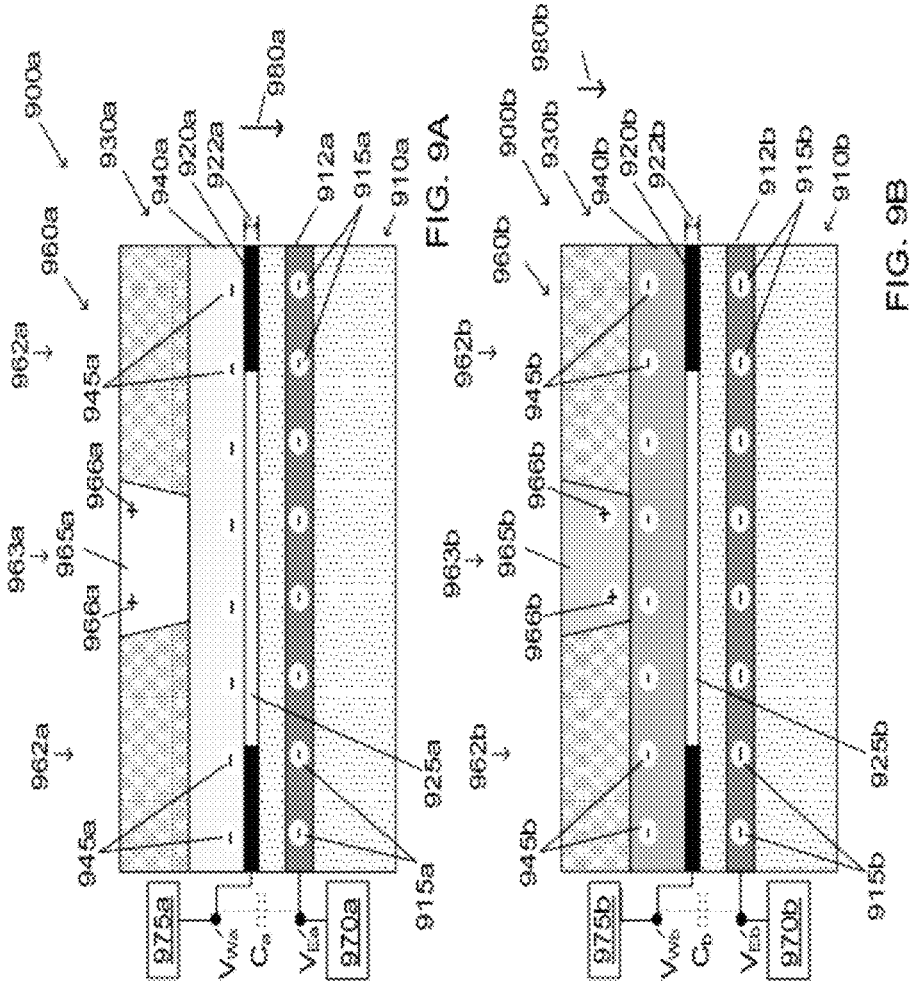

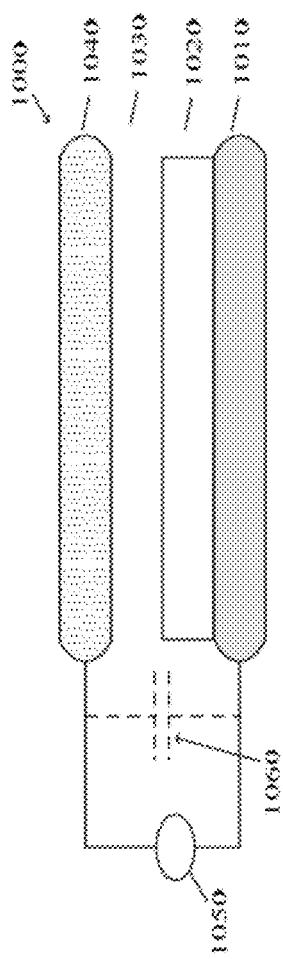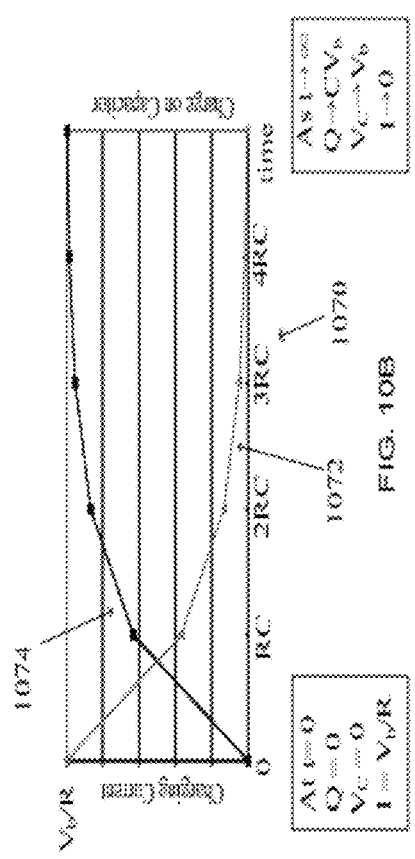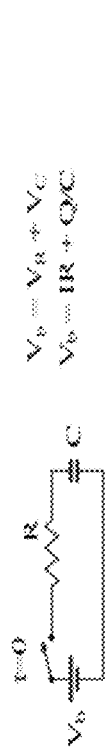

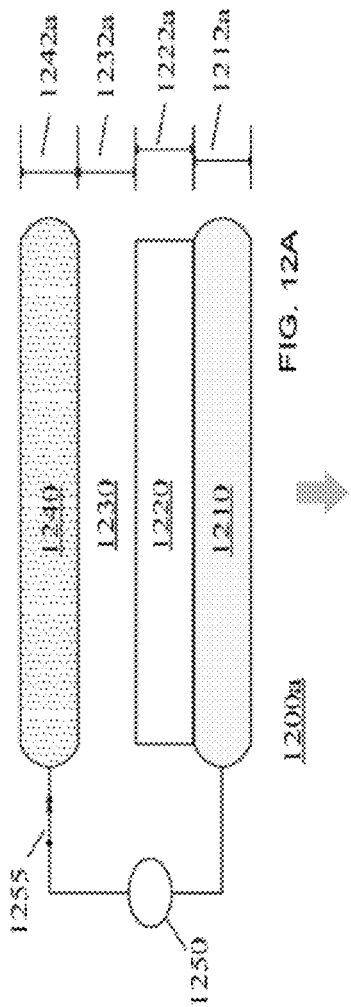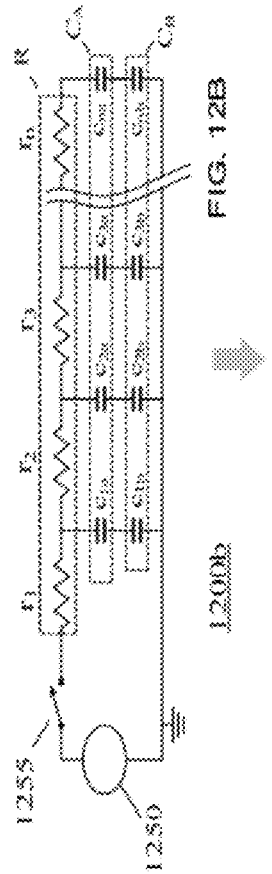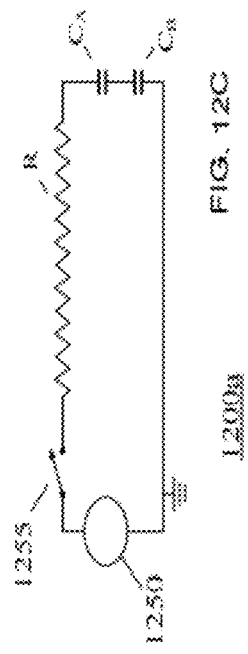

ELECTROSTATIC POST EXPOSURE BAKE APPARATUS AND METHOD

FIELD OF THE INVENTION

The invention relates to wafer processing, and more particularly, to an Electrostatic Post Exposure Bake (EPEB) apparatus and method for using.

BACKGROUND OF THE INVENTION

Following lithographic exposure and prior to pattern developing, exposed lithographic layers, typically organic films, are thermally treated. The thermal treating (baking) of organic films is critical to the manufacturing process used for all integrated circuits. This process is called "post exposure bake" or PEB. Typical films include topcoat barrier layers (TC), topcoat antireflective layers (TARC), bottom antireflective layers (BARC), imaging layers (PR or photoresist) and sacrificial and barrier layers (hard mask) for etch stopping.

The PEB process time and temperature are used to define the characteristics of the circuit features prior to etching the feature into the substrate. By-products of the PEB process are sublimation products (solids) and out-gassing (liquid) materials. These byproducts can build up on the interior of the bake chamber and in the exhaust lines causing defects to fall onto the wafer in process. Typically, a cleaning of the bake system is required when these byproducts build up to certain levels. These methods may not be sensitive enough in future designs to meet sub 32 nm (nanometer) processing requirements. Minimizing defects during wafer processing will continue to be a critical path to attaining cost effective manufacturing of advanced semiconductor devices. Hard particles can block etch processes causing electrical "open" or "short" in the circuit. In lesser size and if fortunate with the location on the device, the hard particle may only create fatal perturbations in the active features' critical dimension (line/space or contact hole).

Advanced lithography applications use acid catalyzed chemically amplified resists to meet both sensitivity and resolution requirements. The quality of the resist pattern is impacted by the initial vertical distribution of photo acid generator (PAG) in the polymeric film after spin coating as well as the acid diffusion length during the post-exposure bake. It has been demonstrated in the literature that an electric field can be used to enhance the mobility of acid (H+) in the direction of the field during the post-exposure bake process. However, the literature demonstration involves the direct contact of a metal plate to the imaging resist. The contact between the metal plate and a resist surface in a hot plate can lead to higher defect levels due the transfer of particles to the metal plate or physical deformation of the image film, which makes the process less desirable for high volume manufacturing. This patent proposes the use of a novel monopole electrostatic chuck design as a means to generate charge on a semiconductor wafer, which produces an electric field across a resist without the direct contact of a top electrode.

It is anticipated contact with electrode will continue to provide problems.

SUMMARY OF THE INVENTION

The invention relates to the use of a novel monopole electrostatic chuck design as a means to generate charge on a semiconductor wafer, which produces an electric field across a resist without the direct contact of a top electrode.

Embodiments of the invention provide an Electrostatic Post Exposure Bake (EPEB) subsystem for providing electrical signals to one or more charge-changing electrodes in an EBP (Electrostatic Bake Plate) used during an EPEB procedure. One or more processing conditions can be monitored and used to control and rapidly adjust the polarity of electrical signals provided to at least one charge-changing electrode in the EBP within a processing chamber in an EPEB subsystem. In addition, the EPEB subsystem can be used for heating-treating wafers before and/or during EPEB procedures. Embodiments of the invention can be applied to developing exposed wafers using different EBP voltages and/or EBP temperatures to improve wafer throughput.

Embodiments of the invention described herein provide a system and method for monitoring the material build-up between an optical source and optical receiver in the exhaust line of a thermal processing unit during PAB (Post Application Bake) procedures. As material builds up on the monitoring windows, the measured optical signal level is reduced. When the measured optical signal level exceeds a user defined adjustable low level, an alarm condition can be established, and a cleaning cycle can be performed.

According to one embodiment, the method includes providing one or more different voltage profiles to an exposed wafer positioned on an EBP in a processing chamber configured in an EPEB subsystem during an EPEB procedure. The different voltage profiles can be created and/or updated using voltage signals from a power supply subsystem. At least one controller can be configured for monitoring the voltage data associated with the EPEB wafer and/or the EBP, analyzing the voltage data, and for controlling the EPEB wafer voltage and/or the EBP voltage in response to the voltage data measured during the EPEB procedure.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 5A-5B illustrate simplified views of an exemplary Electrostatic Bake Plate (EBP) in accordance with embodiments of the invention;

FIGS. 6A-6B illustrate simplified views of another exemplary Electrostatic Bake Plate (EPB) in accordance with embodiments of the invention;

FIG. 8 shows a simplified process flow diagram for another exemplary method of processing a wafer using an EPEB teaching procedure in accordance with embodiments of the invention;

FIG. 9A-9B illustrate schematic representations of an exemplary EPEB procedure in accordance with embodiments of the invention;

FIG. 10A illustrates a simplified block diagram of an exemplary EPEB system in accordance with embodiments of the invention;

FIG. 10B illustrates an exemplary graph for an exemplary RC circuit corresponding to an exemplary EPEB system in accordance with embodiments of the invention;

FIG. 10C illustrates an exemplary RC circuit corresponding to an exemplary EPEB system in accordance with embodiments of the invention;

FIGS. 11A-10B illustrate exemplary block diagrams of exemplary EPEB systems in accordance with embodiments of the invention;

FIG. 12A illustrates a simplified block diagram of another exemplary EPEB system in accordance with embodiments of the invention;

FIG. 12B illustrates an exemplary graph for an exemplary RC circuit corresponding to another exemplary EPEB system in accordance with embodiments of the invention;

FIG. 12C illustrates another exemplary RC circuit corresponding to another exemplary EPEB system in accordance with embodiments of the invention.

DETAILED DESCRIPTION OF SEVERAL EMBODIMENTS

Embodiments of the invention provide a method and processing system for rapidly controlling the temperature of an Electrostatic Bake Plate (EPB) used for supporting and developing wafers during Electrostatic Post Exposure Bake (EPEB) procedures. Embodiments of the invention may be applied to the developing of resist-coated wafers with high wafer throughput. The terms "wafer" and "substrate" are used interchangeably herein to refer to a thin slice of material, such as a silicon wafer or glass substrate, upon which microcircuits are constructed, for example by diffusion, deposition, and etching of various materials.

Figure 1:
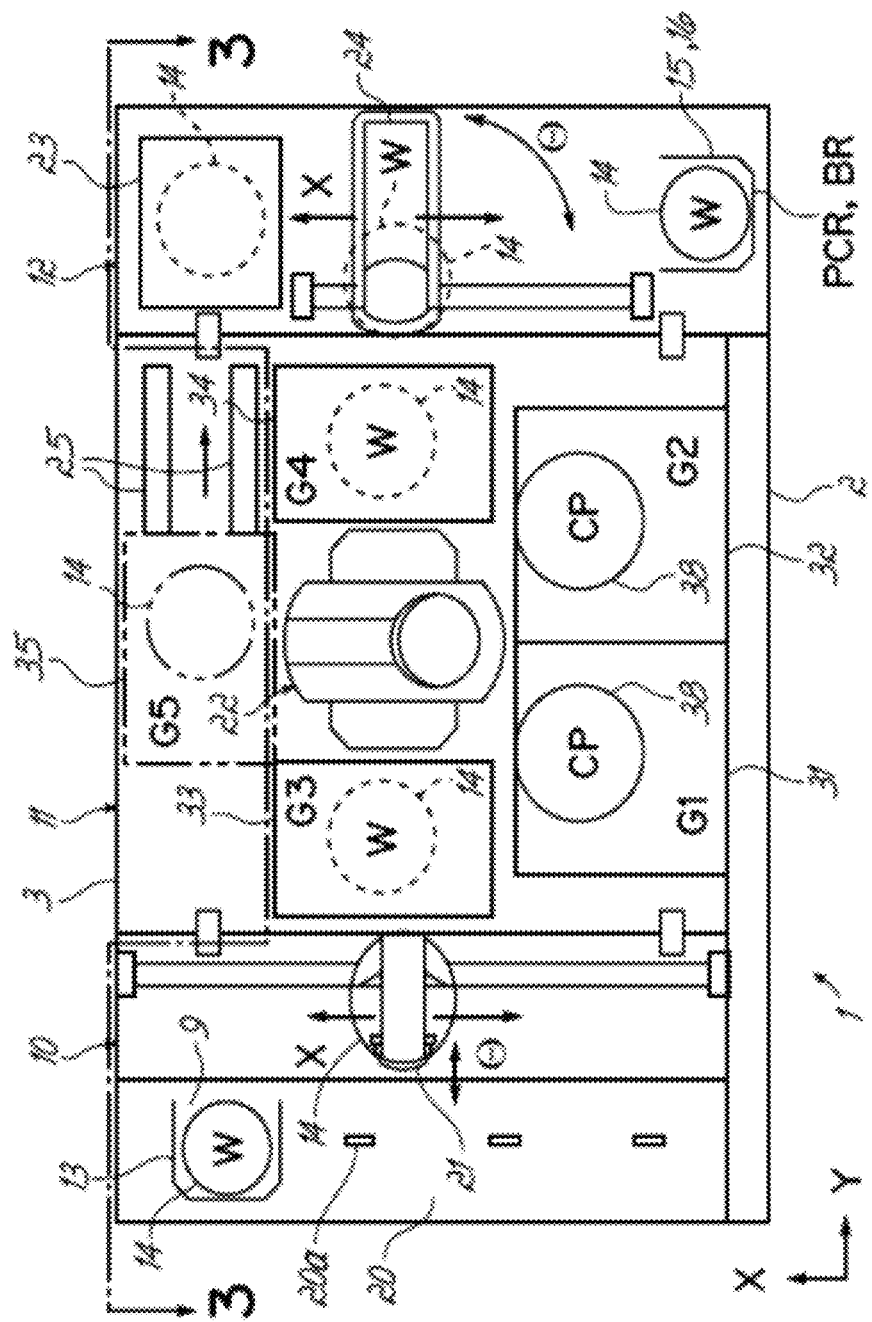
FIG. 1 is a top view of a schematic diagram of a coating/developing system for use in accordance with embodiments of the invention.
Figure 2:
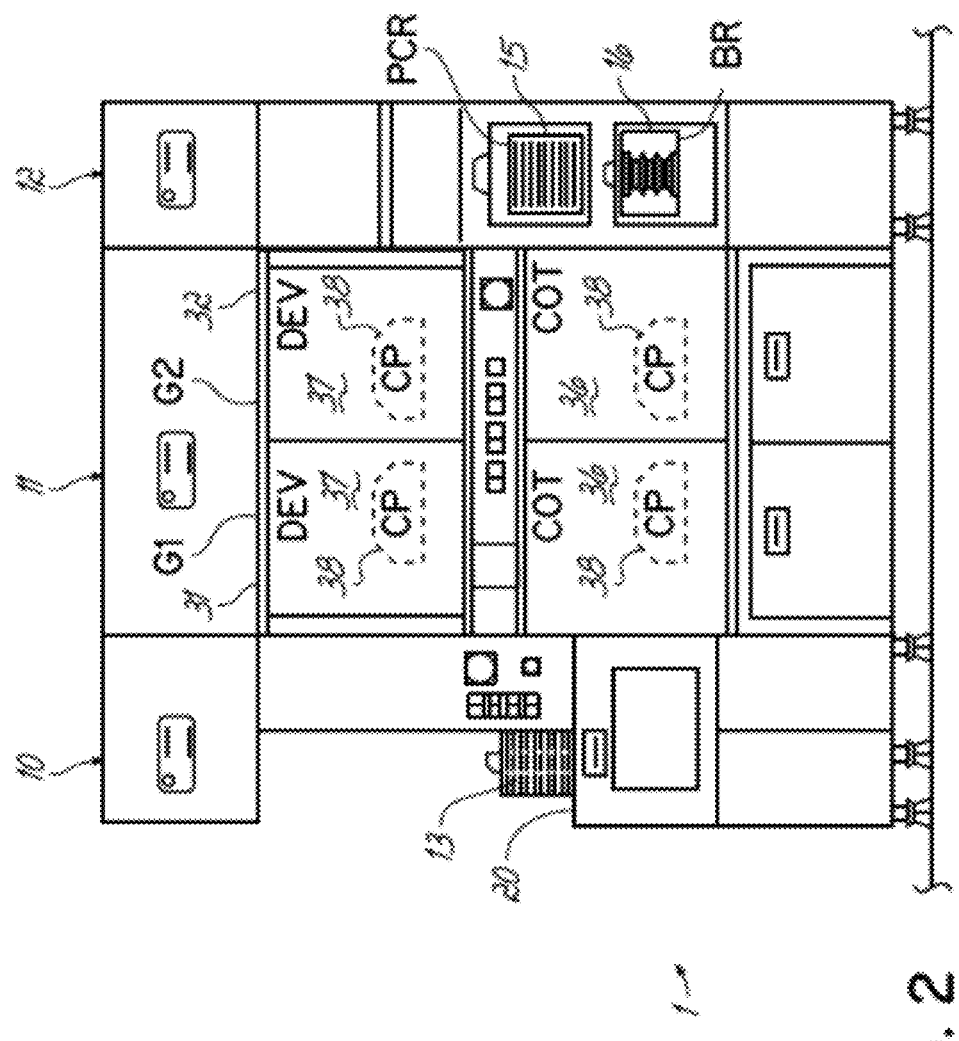
FIG. 2 is a front view of the coating/developing system of FIG. 1.
Figure 3:
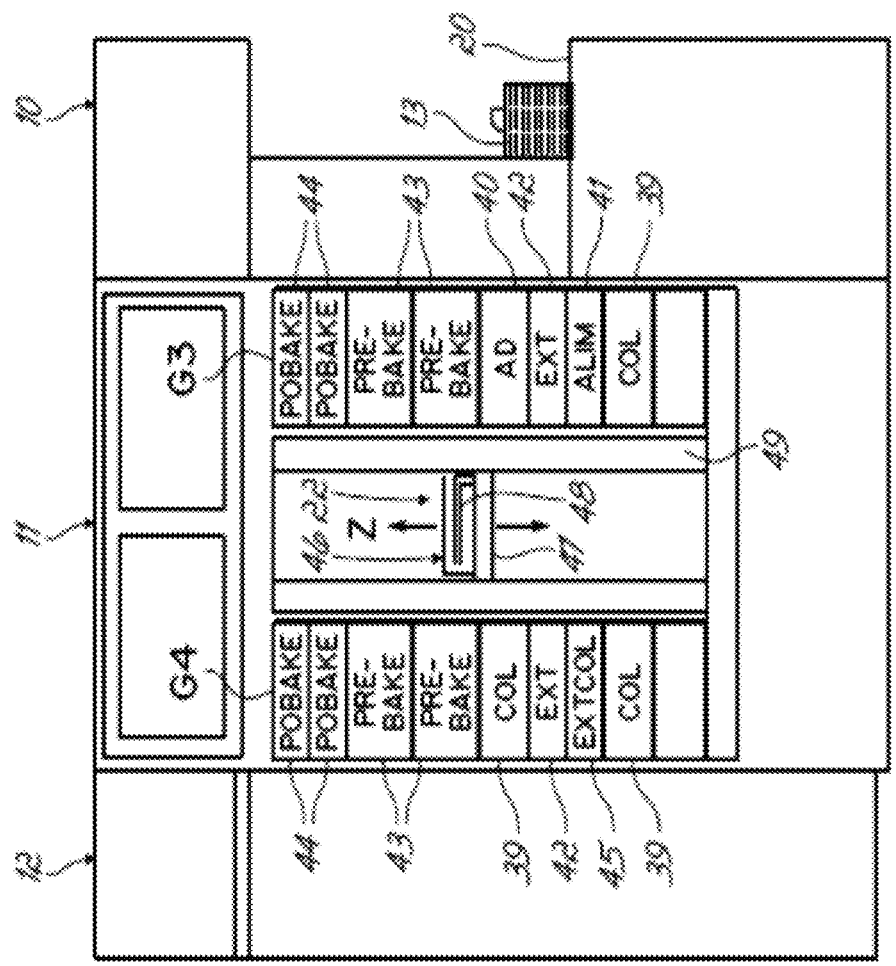
FIG. 3 is a partially cut-away back view of the coating/developing system of FIG. 1, as taken along line 3-3.

With reference to FIGS. 1-3, a coating/developing processing system 1 has a load/unload section 10, a process section 11, and an interface section 12. The load/unload section 10 has a cassette table 20 on which cassettes (CR) 13, each storing a plurality of semiconductor wafers (W) 14 (e.g., 25), are loaded and unloaded from the processing system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and one or more light exposure systems (not shown), and is configured to transfer resist coated wafers between the process section. The one or more light exposure systems can include a resist patterning system such as a photolithography tool that transfers the image of a circuit or a component from a mask or onto a resist on the wafer surface.

The coating/developing processing system 1 also includes a CD metrology system for obtaining CD metrology data from test areas on the patterned wafers. The CD metrology system may be located within the processing system 1, for example at one of the multiple-stage process unit groups 31, 32, 33, 34, 35. The CD metrology system can be a light scattering system such as an optical digital profilometry (ODP) system.

The ODP system may include a scatterometer, incorporating beam profile ellipsometry (ellipsometer), and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). ODP software is available from Timbre Technologies Inc. (2953 Bunker Hill Lane, Santa Clara, Calif. 95054).

When performing optical metrology, such as scatterometry, a structure on a substrate, such as a semiconductor wafer or flat panel, is illuminated with electromagnetic (EM) radiation, and a diffracted signal received from the structure is utilized to reconstruct the profile of the structure. The structure may include a periodic structure, or a non-periodic structure. Additionally, the structure may include an operating structure on the substrate (i.e., a via, or contact hole, or an interconnect line or trench, or a feature formed in a mask layer associated therewith), or the structure may include a periodic grating or non-periodic grating formed proximate to an operating structure formed on a substrate. For example, the periodic grating can be formed adjacent a transistor formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications.

Still referring to FIGS. 1-3, a plurality of projections 20a are formed on the cassette table 20. A plurality of cassettes 13 are each oriented relative to the process section 11 by these projections 20a. Each of the cassettes 13 mounted on the cassette table 20 has a load/unload opening 9 facing the process section 11.

The load/unload section 10 includes a first sub-arm mechanism 21 that is responsible for loading/unloading the wafer W into/from each cassette 13. The first sub-arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as further described below.

With specific reference to FIG. 3, a main arm mechanism 22 is liftably arranged at the center of the process section 11. The process units G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of θ. The wafer transporting system 46 has a plurality of holder portions 48 movable in a front and rear direction of a transfer base table 47.

Units belonging to first (G1) and second (G2) process unit groups 31, 32, are arranged at a front portion 2 of the coating/developing processing system 1. Units belonging to the third (G3) process unit group 33 are arranged next to the load/unload section 10. Units belonging to a fourth (G4) process unit group 34 are arranged next to the interface section 12. Units belonging to a fifth (G5) process unit group 35 are arranged in a back portion 3 of the processing system 1.

With reference to FIG. 2, the first (G1) process unit group 31 has two spinner-type process units for applying a predetermined treatment to the wafer 14 mounted on a spin chuck (not shown) within a cup (CP) 38. In the first (G1) process unit group 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. In an exemplary embodiment, the resist coating unit (COT) 36 is set at a lower stage than the developing unit (DEV) 37 because a discharge line (not shown) for the resist waste solution is desired to be shorter than a developing waste solution for the reason that the resist waste solution is more difficult to discharge than the developing waste solution. However, if necessary, the resist coating unit (COT) 36 may be arranged at an upper stage relative to the developing unit (DEV) 37.

With reference to FIG. 1 and FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom.

Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although, only two prebaking units 43 and only two postbaking units 44 are shown, G3 and G4 may contain any number of prebaking units 43 and postbaking units 44. Furthermore, any or all of the prebaking units 43 and postbaking units 44 may be configured to perform Post Exposure Bake (PEB), Post Application Bake (PAB), and/or Electrostatic Post Exposure Bake (EPEB) procedures.

In an exemplary embodiment, the cooling unit (COL) 39 and the extension cooling unit (EXTCOL) 45, to be operated at low processing temperatures, are arranged at lower stages, and the prebaking unit (PREBAKE) 43, the postbaking unit (POBAKE) 44 and the adhesion unit (AD) 40, to be operated at high temperatures, are arranged at the upper stages. With this arrangement, thermal interference between units may be reduced. Alternatively, these units may have different arrangements.

At the front side of the interface section 12, a movable pick-up cassette (PCR) 15 and a non-movable buffer cassette (BR) 16 are arranged in two stages. At the backside of the interface section 12, a peripheral light exposure system 23 is arranged. The peripheral light exposure system 23 can contain a lithography tool. Alternately, the lithography tool and the ODP system may be remote to and cooperatively coupled to the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension unit (EXT) 42 located in the fourth (G4) processing unit 34 but also to a wafer transfer table (not shown) near a remote light exposure system (not shown).

In the processing system 1, the fifth (G5) processing unit group 35 may be arranged at the back portion 3 of the backside of the main arm mechanism 22. The fifth (G5) processing unit group 35 may be slidably shifted in the Y-axis direction along a guide rail 25. Since the fifth (G5) processing unit group 35 may be shifted as mentioned, maintenance operation may be applied to the main arm mechanism 22 easily from the backside.

The prebaking unit (PREBAKE) 43, the postbaking unit (POBAKE) 44, and the adhesion unit (AD) 40 can each include a PAB curing system in which wafers 14 are heated to temperatures above room temperature.

Figure 4A:
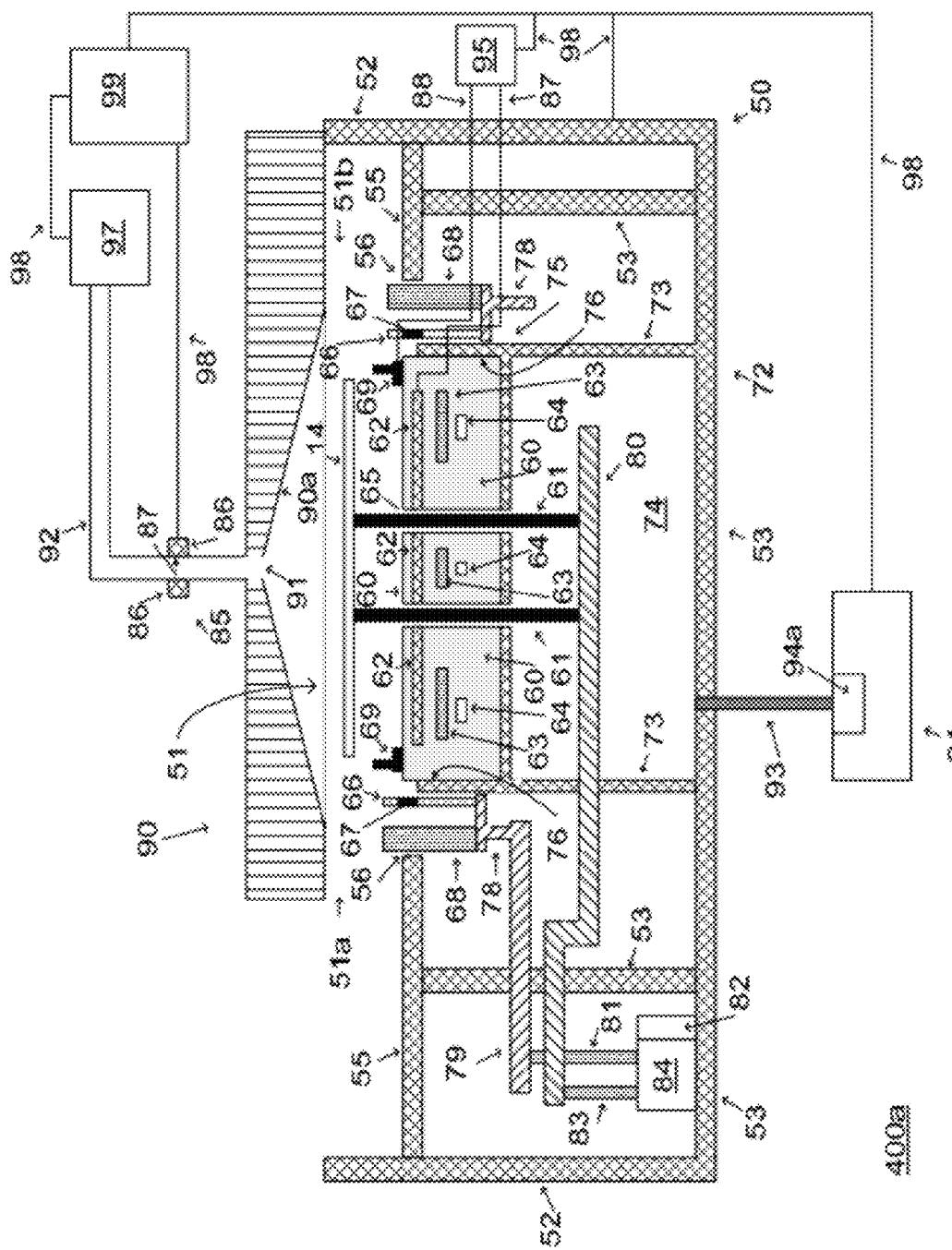
FIGS. 4A-4C illustrate simplified views of exemplary Electrostatic Post Exposure Bake (EPEB) processing systems in accordance with embodiments of the invention.
Figure 4B:
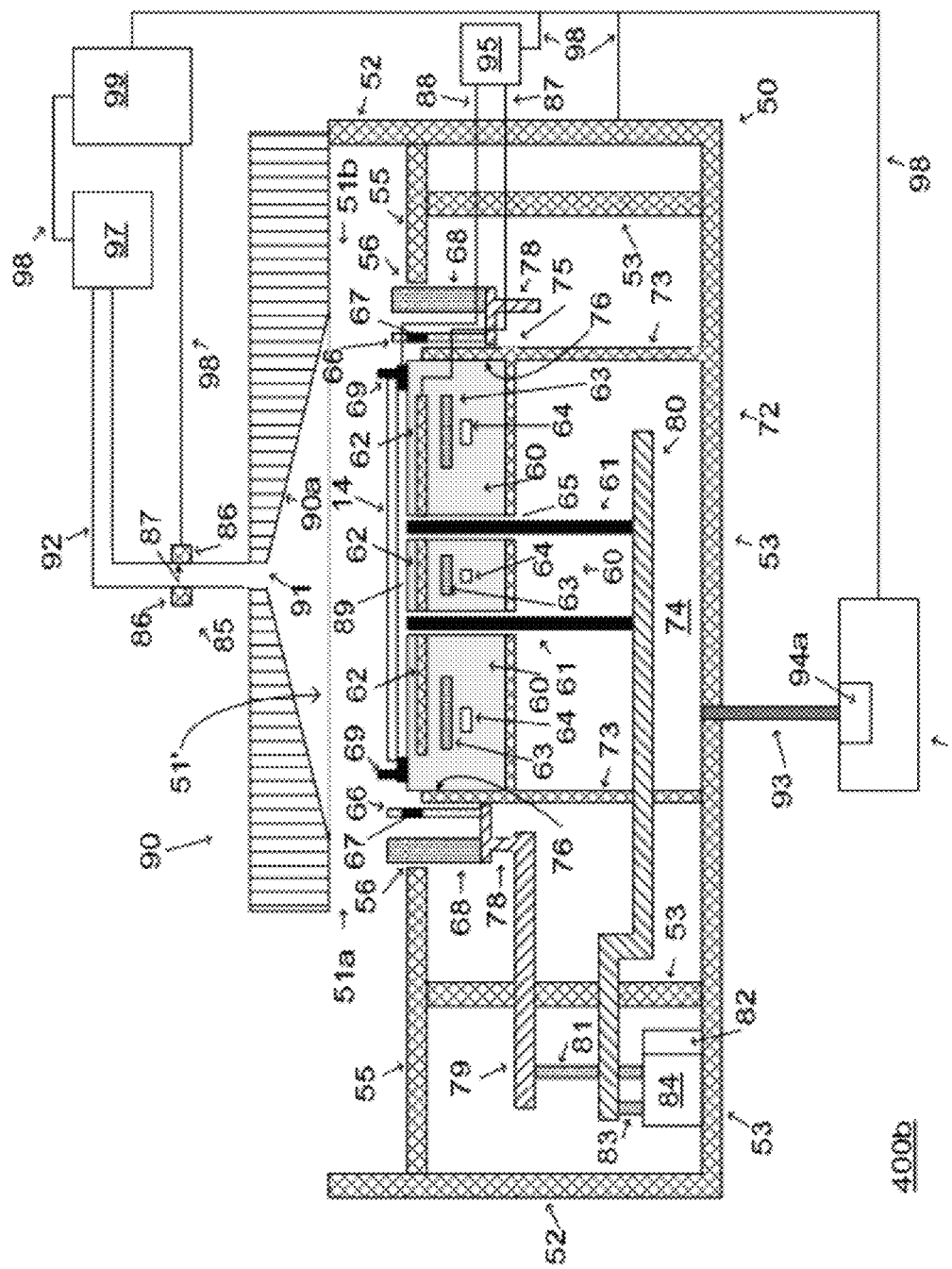

FIG. 4A and FIG. 4B show views of EPEB processing systems (400a, 400b). In some embodiments, the EPEB processing systems (400a, 400b) can be configured to perform Electrostatic Post Exposure Bake (EPEB) procedures. Alternatively, the EPEB processing systems (400a, 400b) may be configured to perform Post Exposure Bake (PEB) procedures. A simplified cross-sectional view of the EPEB subsystem 50 is shown in each of the EPEB processing systems (400a, 400b). Exemplary views of a process gas subsystem 94, a power supply subsystem 95 and a controller 99 are shown in each of the EPEB processing systems (400a, 400b). In addition, exemplary views of an exhaust subsystem 97, an exhaust line 92, and measuring devices 85 are shown in each of the EPB processing systems (400a, 400b). Alternatively, the measuring devices 85 may not be required. The measuring devices 85 can be coupled to one or more of the exhaust lines 92, and the measuring devices 85 can be configured with one or more optical signals 86 therein.

The controller 99 can be coupled to the process gas subsystem 94, the measuring devices 85, and the exhaust subsystem 97 using one or more bi-directional signal busses 98. In various examples, the measuring devices 85 can be single frequency devices, can be narrow band devices, or can be wideband devices, or any combination thereof.

In addition, the controller 99 can be coupled to the EPEB subsystem 50, and can be used to communicate and/or control a lifting cylinder 84, the heating elements 63, and the sensors 64. For example, the sensors 64 can be used to measure temperatures, electrical voltages, electrical currents, and/or electrical fields associated with EPEB procedures.

Controller 99 may be coupled to a processing system controller that are configured in the coating/developing processing system 1 and that can be configured to provide data to the EPEB processing systems (400a, 400b). The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can include uniformity data.

As shown in FIG. 4A and FIG. 4B, the EPEB subsystem 50 includes a processing chamber 51, an EBP 60, and at least one bake plate cover assembly 90. One or more heating elements 63 can be embedded in the EBP 60, one or more sensors 64 can be embedded in the EBP 60, and one or more electrodes 62 can be embedded in the EBP 60. For example, sensors 64 can be used to measure the EBP temperature and/or the wafer temperature, and each sensor can be a physical sensor and/or a virtual sensor. In addition, sensors 64 can be used to measure the EBP voltages, the wafer voltages and/or the electrode voltages. Alternatively, other sensors (not shown) may be used to measure other chamber conditions.

In addition, a plurality of small wafer supports 69 can be configured on and isolated from an upper surface of the EBP 60 for accurately positioning the wafer 14. When the wafer 14 is mounted on the EBP 60, the top portions of these small wafer supports 69 can contact the backside surface of the wafer 14, and a small gap 89 can be established between the wafer 14 and the EBP 60 that prevents the backside surface of the wafer 14 from being strained and/or damaged. Alternatively, other wafer support means may be used.

The EPEB processing systems (400a, 400b) can include at least one power supply subsystem 95, and one or more first control lines 87 can be used to connect the power supply subsystem 95 to one or more of the electrodes 62 configured in the EBP 60. During various EPEB procedures, the power supply subsystem 95 can be used to provide signals to one or more of the electrodes 62 and/or receive signals from one or more of the electrodes 62. For example, one or more of the first control lines 87 can be used to provide one or more EBP voltage profiles to the electrode 62 at the bottom side of the wafer 14 when the wafer 14 is resting on the small wafer supports 69. In addition, the power supply subsystem 95 and one or more of the first control lines 87 can be used to measure the EBP voltage profiles on the electrode 62 in the EBP 60 and/or the wafer 14 when the bottom of the wafer 14 is positioned above the EBP 60 on the small wafer supports 69. The power supply subsystem 95 can provide AC voltages, DC voltages, and/or pulsed voltages to one or more of the electrodes 62.

In addition, the EPEB processing systems (400a, 400b) can include at least one power supply subsystem 95, and one or more second control lines 88 can be used to connect the power supply subsystem 95 to one or more of the small wafer supports 69 on the EBP 60. During various EPEB procedures, the power supply subsystem 95 can be used to provide signals to one or more of the small wafer supports 69 and/or receive signals from one or more of the small wafer supports 69. For example, one or more of the second control lines 88 can be used to provide one or more wafer voltage profiles to the wafer 14 when the bottom of the wafer 14 is touching the small wafer supports 69. In addition, the power supply subsystem 95 and one or more of the first control lines 87 can be used to measure the wafer voltage profiles associated with the wafer 14 when the bottom of the wafer 14 is touching the small wafer supports 69.

The bake plate cover assembly 90 can include an inner surface 90a that can be configured to form a portion of the processing chamber 51. For example, the wafer 14 can be 200 mm, 300 mm, or 450 mm in diameter, and the diameter of the EBP can be 2-10 mm greater than the diameter of the wafer 14.

The EPEB subsystem 50 can include at least one vertical sidewall 52, and at least one bottom wall 72 coupled to the at least one vertical sidewall 52. The vertical sidewall 52 and the bottom wall 72 can have circular, or elliptical, or square, or rectangular shapes. The EPEB subsystem 50 can include at least one first interior wall 53 and one or more second interior walls 73 coupled to the bottom wall 72 and/or the horizontal shielding plate 55. The first interior wall 53 and the second interior wall 73 can have circular, or elliptical, or square, or rectangular shapes. At least one horizontal shielding plate 55 can be coupled to at least one of the vertical sidewalls 52, and the horizontal shielding plate 55 can have a circular, or an elliptical, or a square, or a rectangular shape.

A first opening 56 can be formed at the center of the horizontal shielding plate 55, and the first opening 56 can have a circular, or an elliptical, or a square, or a rectangular shape. A first supporting plate 75 configured below the horizontal shielding plate 55 within the first opening 56, and the first supporting plate 75 can have circular, or elliptical, or a square, or a rectangular shape. The first supporting plate 75 can include a mounting region 76 that can be formed at the center of the first supporting plate 75 and the EBP 60 can be configured in the mounting region 76. The EBP 60 and the mounting region 76 can have circular, or elliptical, or square, or rectangular shapes.

The first supporting plate 75 can be coupled to at least one of the bottom walls 72 using one or more of the second interior walls 73. Alternatively, the first supporting plate 75 may be configured and/or mounted differently. In some examples, one or more of the second interior walls 73 can be positioned within the compartment 74 or can be used to form at least one portion of the compartment 74.

The EBP 60, the electrode 62, and the first supporting plate 75 can include a plurality of through-holes 65 and a plurality of lift pins 61 can be inserted into the through-holes 65. The lift pins 61 can be connected to and supported by a first support arm 80, which is further connected to and supported by a first lifting rod 83 of a lifting cylinder 84. When the first lifting rod 83 is actuated to move relative to the first lifting cylinder 84, the lift pins 61 can move vertically relative to the EBP 60, thereby lifting or lowering the wafer 14 from the upper surface of the EBP 60. In some embodiments, the lift pins 61 may include sensing elements (not shown) that can be used to determine wafer position, curvature, and/or voltages.

In addition, the shutter 68, the supply ring 66 can be configured proximate to the horizontal shielding plate 55 within the first opening 56, and the second supporting plate 78 can have circular, or elliptical, or a square, or a rectangular shape. At least one shutter 68 and at least one supply ring 66 can be coupled to the top surface of the second supporting plate 78, and the shutter 68 and the supply ring 66 can have circular, or elliptical, or square, or rectangular shapes. The second supporting plate 78 can be connected to and supported by a second support arm 79, which is further connected to and supported by a second lifting rod 81 of a second lifting cylinder 82. When the second lifting rod 81 is actuated to move vertically relative to the second lifting cylinder 82, the shutter 68 and the supply ring 66 can be can move vertically relative to the EBP 60, thereby opening or closing the process chamber 51.

Air holes 67 can be formed along the periphery of the supply ring 66 at intervals of central angles of about two degrees. The air holes 67 can communicate with a cooling gas supply source (not shown). Alternatively, the supply ring 66 may be configured differently and/or mounted differently. When the supply ring 66 is in the "up" position, a gas, such as nitrogen gas or air, can be exhausted using the air holes 67. For example, air holes 67 can be used to expose one or more surfaces of the EBP 60 to an inert gas stream for rapidly cooling the one or more surfaces and the rest of the EBP 60 when a wafer is not present on the EBP 60. For example, the inert gas can include argon (Ar) or nitrogen ($N_2$). In addition, air holes 67 can be used to expose one or more surfaces of the wafer 14 to an inert gas stream for rapidly cooling the one or more surfaces of the wafer 14 when a wafer is not positioned on the EBP 60.

In FIG. 4A, the EPEB subsystem 50 is shown in the transfer mode, and the process chamber 51 is shown in an open configuration. When the process chamber is in an open configuration, openings 51a and 51b can be formed at a front surface side (aisle side of the main arm mechanism 22) and a rear surface side of the processing chamber 51, respectively. The wafer 14 can be loaded into and unloaded from the processing chamber 51 through the openings 51a, and 51b.

The lift pins 61, the first support arm 80, the first lifting rod 83 of the first lifting cylinder 84 can be in an "up" position, and the when the lift pins 61 are in the first "up" position the wafer 14 can be in a "transfer" position as shown in FIG. 4A.

When the first lifting rod 83 is actuated to protrude from the first lifting cylinder 84, the lift pins 61 can protrude from the EBP 60, thereby lifting the wafer 14 from the upper surface of the EBP 60.

In addition, the shutter 68, the supply ring 66, the second supporting plate 78, the second lifting rod 81 of the second lifting cylinder 82 can be in a first "down" position, and the when the shutter 68 and the supply ring 66 are in the "down" position the wafer 14 can be in a transfer position as shown in FIG. 4A. When the second lifting rod 81 is in a first position as shown in FIG. 4A, the shutter 68 and the supply ring 66 can be in a "down" position and openings 51a, and 51b can be established in the process chamber 51 and wafer 14 can be transferred into or out of the process chamber 51.

In FIG. 4B, the EPEB subsystem 50 is shown in an operating mode, and the process chamber 51 is shown in a closed configuration. When the process chamber is in a closed configuration, the shutter 68, the supply ring 66 can be used to close the openings 51a, and 51b. The wafer 14 can be positioned proximate to the top surface of the EBP 60 and can be processes in the closed process chamber 51.

The lift pins 61, the first support arm 80, the first lifting rod 83 of the first lifting cylinder 84 can be in a "down" position, and the when the lift pins 61 are in the "down" position the wafer 14 can be in a "process" position as shown in FIG. 4B. When the first lifting rod 83 is actuated to protrude from the first lifting cylinder 84, the lift pins 61 can protrude from the EBP 60, thereby lifting the wafer 14 from the upper surface of the EBP 60.

In addition, the shutter 68, the supply ring 66, the second supporting plate 78, the second lifting rod 81 of the second lifting cylinder 82 can be in an "up" position, and when the shutter 68 and the supply ring 66 are in the "up" position the wafer 14 can be in the "process" position as shown in FIG. 4B. When the second lifting rod 81 is in the second position as shown in FIG. 4B, the shutter 68 and the supply ring 66 can be in an "up" position and openings 51a, and 51b can be closed and wafer 14 can be processed in the closed process chamber 51.

Gas generated from the surface of the wafer 14 before, during, and/or after the curing procedure can be exhausted through the exhaust port 91 configured in the bake lid cover assembly 90 and vented from the processing chamber 51 via exhaust line 92 to the exhaust subsystem 97.

With reference to FIGS. 4A and 4B, a compartment 74 is defined by the horizontal shielding plate 55, two interior walls 53, and a bottom wall 72 formed below the horizontal shielding plate 55. Bake plate supporting plate 75, second supporting plate 78, second support arm 79, first support arm 80, and lifting cylinders 82, 84 can be arranged in the compartment 74.

With reference to FIGS. 4A and 4B, at least one measuring device 85 can be coupled to one or more exhaust lines 92 of the EPEB subsystem 50. The exhaust lines 92 can be configured with one or more measuring devices 85, and the measuring devices 85 can be configured using transparent tubing material, such as glass or quartz. Alternatively, the monitoring devices may be configured differently. For example, one or more optical signals 86 can be established within the measuring device 85, and the measuring device 85 can be configured to optimize the measured value for one or more of the optical signals 86. In some alternate embodiments, the measured value for at least one of the optical signals can be used to determine the exhaust (trace) gas data during an EPEB (developing) procedure, the amount of contamination on the measuring devices 85, the amount of contamination in the exhaust lines 92, and/or the amount of contamination in the processing chamber 51.

For example, the exhaust lines 92 can include one or more flexible hoses so the bake lid cover assembly 90 can move back and forth between transfer procedures and thermal processing procedures. In some examples, the measuring devices 85 can operate during transfer procedures to determine if the inner surface 90a is clean or is contaminated, and when the devices 85 or the exhaust subsystem 97 determines that the inner surface 90a is contaminated, the EPEB subsystem 50 can be taken off-line to prevent particles from being created on the wafer 14.

The measuring devices 85 can be used to measure the exhaust gasses from the processing chamber 51 and/or the wafer 14 before, during, and/or after one or more EPEB procedures are performed.

In some embodiments, the exhaust (trace) gas data obtained from the measuring devices 85 and/or the exhaust subsystem 97 can be used as feedback or feed-forward data to control the EPEB procedure that is currently being performed, can be used as teaching data to control or optimize a future EPEB procedure, can be used to determine when the wafer temperature is incorrect, can be used to determine if the processing chamber 51, the exhaust lines 92, or the measuring devices 85 are contaminated, can be used in real-time to update the EPEB procedure for the next wafer in a wafer lot, can be used to determine when to stop a EPEB procedure, or can be used to determine when to perform a cleaning procedure. For example, teaching data can be obtained from a teaching procedure.

FIGS. 5A-5B illustrate simplified views of an exemplary Electrostatic Bake Plate (EPB) in accordance with embodiments of the invention. FIG. 5A illustrates a simplified top view of a first EBP 60' having a plurality of circular (annular) segments (510, 520, and 530). A plurality of heating elements (515, 525, and 535) can be embedded in a plurality of circular (annular) segments (510, 520, and 530) in the first EBP 60', and a plurality of sensors 64' can be configured in the first EBP 60'. In alternate embodiments, EBP 60' may incorporate a cooling element and/or a combined heating/cooling element rather than a heating element. In addition, a first electrode 62' can be configured within a top portion of the first EBP 60', and first electrode 62' can have a diameter that is smaller than the diameter of the first EBP 60'. In alternate embodiments, first electrode 62' may have a non-circular shape and may include segments rather than a single element.

FIG. 5B illustrates a simplified side view of the first EBP 60' and the plurality of circular (annular) segments (510, 520, and 530). The plurality of heating elements (515, 525, and 535) are shown embedded in a plurality of circular (annular) segments (510, 520, and 530) in the first EBP 60', and the plurality of sensors 64' are shown above the plurality of heating elements (515, 525, and 535) in the first EBP 60'. The first electrode 62' is shown embedded above the circular (annular) segments (510, 520, and 530) in the first EBP 60', and the plurality of sensors 64' are shown below the first electrode 62' in the first EBP 60'.

FIGS. 6A-6B illustrate simplified views of another exemplary Electrostatic Bake Plate (EPB) in accordance with embodiments of the invention. FIG. 6A illustrates a simplified top view of a first EBP 60' having a plurality of first multi-section circular (annular) segments (610a, 610b, 610c, and 610d); a plurality of second multi-section circular (annular) segments (620a, 620b, 620c, and 620d); and a plurality of third multi-section circular (annular) segments (630a, 630b, 630c, and 630d). A first multi-segmented heating element (615a, 615b, 615c and 615d) can be embedded in the first multi-section circular (annular) segments (610a, 610b, 610c, and 610d) in the second EBP 60"; a second multi-segmented heating element (625a, 625b, 625c and 625d) can be embedded in the second multi-section circular (annular) segments (620a, 620b, 620c, and 620d) in the second EBP 60"; a third multi-segmented heating element (635a, 635b, 635c and 635d) can be embedded in the third multi-section circular (annular) segments (630a, 630b, 630c, and 630d) in the second EBP 60". A plurality of second sensors 64" can be configured in the second EBP 60". In alternate embodiments, the second EBP 60" may incorporate a cooling element and/or a combined heating/cooling element rather than a heating element. In addition, a second electrode 62" can be configured within a top portion of the second EBP 60", and second electrode 62" can have a diameter that is smaller than the diameter of the second EBP 60". In alternate embodiments, second electrode 62" may have a non-circular shape and may include segments rather than a single element.

FIG. 6B illustrates a simplified side view of the second EBP 60" and the plurality of multi-section circular (annular) segments (610abcd, 620abcd, and 630abcd). The plurality of multi-segmented heating element (615abcd, 625abcd, and 635abcd) are shown embedded in a plurality of multi-section circular (annular) segments (610abcd, 620abcd, and 630abcd) in the second EBP 60", and the plurality of second sensors 64" are shown above the plurality of multi-segmented heating element (615abcd, 625abcd, and 635abcd) in the second EBP 60". The second electrode 62" is shown embedded above the multi-section circular (annular) segments (610abcd, 620abcd, and 630abcd) in the second EBP 60", and the plurality of second sensors 64" are shown below the second electrode 62" in the second EBP 60".

Controller 99 can comprise a microprocessor, a memory (e.g., volatile and/or non-volatile memory), and a digital I/O port. A program stored in the memory may be utilized to control the aforementioned components of the EBP processing systems (400a and 400b) according to an EPEB and/or PEB process recipe. Controller 99 can be configured to analyze the exhaust gas data, the temperature data, and/or the CD metrology data, to compare this data and/or other data to historical and/or real-time exhaust data limits, and to use the comparison to change a EPEB and/or PEB process recipe and/or control the processing system components during EPEB and/or PEB procedures.

The process gas subsystem 94 may comprise one or more flow control devices 94a that can be used to control the type and amount of process gas provided by the supply line 93. In some embodiments, the process gas subsystem 94 can be used to control the flow of an inert gas to the EPEB subsystem 50 and/or can be used to control the flow of a solvent to the EPEB subsystem 50.

Figure 7:
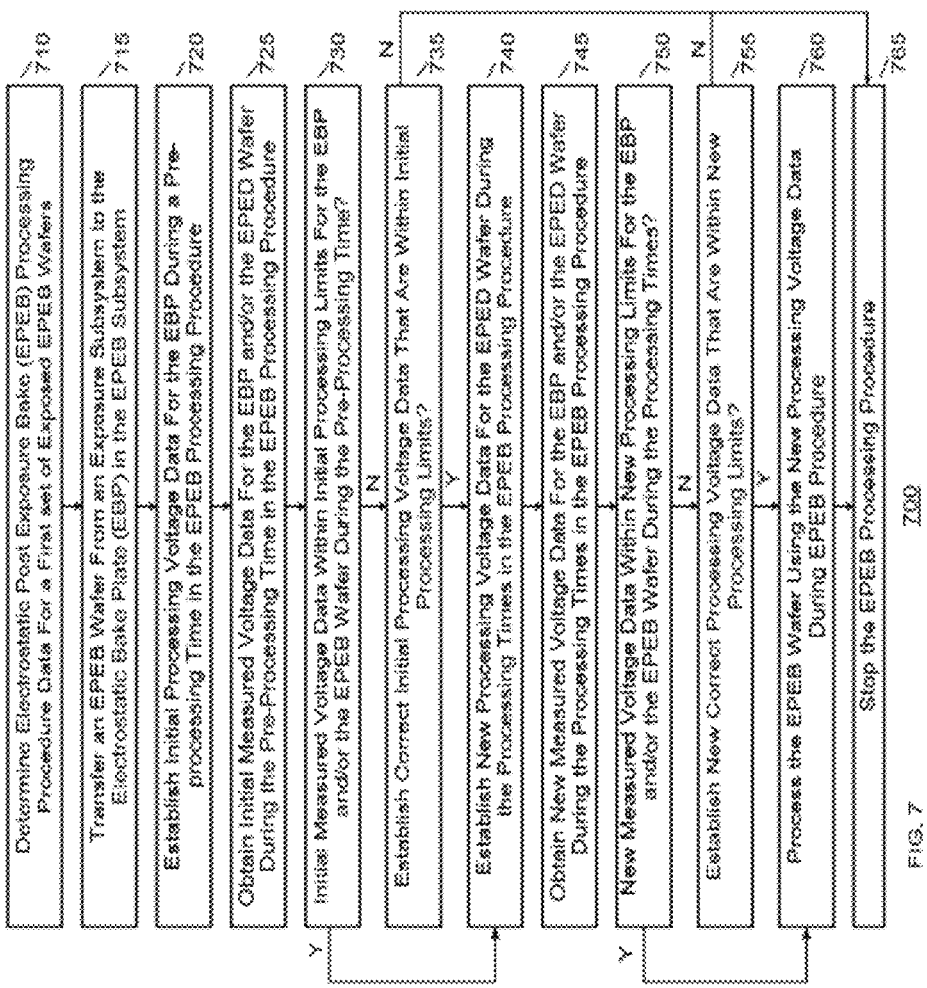
FIG. 7 shows a simplified process flow diagram for an exemplary method of processing an exposed wafer in accordance with embodiments of the invention.

FIG. 7 shows a simplified process flow diagram for an exemplary method of processing an exposed wafer in accordance with embodiments of the invention. In the illustrated embodiment shown in FIG. 7, an exemplary EPEB procedure 700 is shown that can be used to process one or more wafers using the EPEB processing systems (400a and 400b). The EPEB procedure 700 represents an exemplary method for operating and/or controlling the EPEB subsystem (50) and the power supply subsystems (95) that are configured in the EPEB processing systems (400a and 400b). For example, one or more substrate/wafers can be processed using a one or more EPEB subsystems (50) and one or more of the power supply subsystems (95) configured in the coating/developing processing system 1, illustrated in (FIGS. 1-3).

In 710, first EPEB procedure data can be determined for a first set of exposed wafers/substrates that are to be processed using the EPEB processing systems (400a and 400b). The EPEB procedure can be determined for each of the exposed wafers/substrates using historical and/or real-time data. For example, the exposed wafers/substrates can include an exposed masking layer on top of other layers, and the masking layer can include dual-tone resist material, freezable or frozen resist material, hardened resist material, Ultra-Violet (UV) resist material, Extreme Ultra-Violet (EUV) resist material, organic material, or non-organic material, or any combination thereof. In addition, the other layers can include Anti-Reflective Coating (ARC) material, Bottom Anti-Reflective Coating (BARC) material, Top Anti-Reflective Coating (TARC) material, semiconductor material, ceramic material, metallic material, dielectric material, doped material, stressed material, strained material, carbon material, or glass material, or any combination thereof.

In some embodiments, initialization procedures can be performed for the EPEB procedure. For example, a first counting variable (n) and a processing limit (N) can be established for the EPEB processing times ($t_n$); the first counting variable (n) can have an integer value greater than zero, and the processing limit (N) can be an integer having a value greater than ten. In addition, a second counting variable (m) and a counting limit (M) can be established for the plurality of EPEB processing wafers ($PW_m$); the second counting variable (m) can have an integer value greater than zero; and the counting limit (M) can be an integer having a value greater than two. Alternatively, the processing limit (N) and/or the counting limit (M) may have different values. In some examples, the processing times ($t_n$) can be used to illustrate time points, and in other examples, the processing times ($t_n$) can be used to illustrate periods of time. In various embodiments, the total EPEB processing time ($P_{Proc}$) for an EPEB procedure can vary from about 50 seconds to about 300 seconds.

In 715, the EPEB wafer (14) can be transferred from an exposure system to an EBP (60, 60', or 60") in the EPEB subsystem (50) that can be configured in the coating/developing processing system 1 illustrated in (FIGS. 1-3). The EPEB wafer (14) can comprise an exposed masking layer (960a, FIG. 9A) that includes an exposed (latent) image having exposed regions (963a, FIG. 9A) and unexposed regions (962a, FIG. 9A), and the exposed regions (963a, FIG. 9A) can include a plurality of first activated species (966a, FIG. 9A). For example, the exposed regions (963a, FIG. 9A) can include developable masking layer material, and unexposed regions (962a, FIG. 9A) can include un-developable masking layer material.

During the first pre-processing time ($t_{p1}$) in the EPEB processing procedure, the lift pins (61) can be in the first "up/transfer" position, and the EPEB wafer (14) that requires "developing" can be in a "transfer" position on top of the lift pins (61) as shown in FIG. 4A. For example, first pre-processing voltage ($EBPV_1$) data can be established on the EBP (60, 60', or 60"), and the EPEB wafer (14) can have one or more first wafer voltages ($WV_1$) associated therewith when the EPEB wafer (14) is positioned on top of the lift pins (61) as shown in FIG. 4A. In addition, a first temperature profile ($TP_1$) can be established for the EBP (60, 60', or 60") during the first pre-processing time ($t_{p1}$), and first input power ($IP_1$) can be provided to at least one of the heating elements embedded in the EBP (60, 60', or 60") during the first pre-processing time ($t_{p1}$).

In 720, initial processing voltage data can be established for the EBP (60, 60', or 60") that can be configured in the EPEB subsystem (50) during the first pre-processing time ($t_{p1}$) in an EPEB procedure. The EPEB procedure data and/or the exposure data can be used to determine the initial processing voltage data for the EPEB wafers, and the EPEB subsystem (50) and the power supply subsystem (95) can be used to establish the initial processing voltage data.

In some examples, one or more EBP voltage profiles can be provided to one or more of the electrodes (62) by the power supply subsystem (95) using the first control line (87) during the first pre-processing time ($t_{p1}$) in the EPEB procedure. In other examples, one or more wafer voltage profiles can be provided to the small wafer supports (69) by the power supply subsystem (95) using the second control line (88) during the first pre-processing time ($t_{p1}$) in the EPEB procedure. In still other examples, the power supply subsystem (95) can provide one or more EBP voltage profiles to the electrodes (62), and can provide one or more wafer voltage profiles to the small wafer supports (69) during the first pre-processing time ($t_{p1}$) in the EPEB procedure. For example, a first value (n=1) can be created to established an initial EPEB processing time ($t_1$), and an initial value (m=1) can be determined for the first EPEB wafer ($PW_1$). In addition, the shutter (68) and/or the supply ring (66) can be configured in a first position, thereby establishing an open state for the processing chamber (51) during the first pre-processing time.

During a second pre-processing time ($t_{p2}$) in the EPEB procedure, the lift pins (61) can be in a "down" position, and the EPEB wafer (14) that requires "developing" can be in a "processing" position on the small wafer supports (69), thereby establishing a gap (89) between the bottom of the EPEB wafer and the upper surface of the EBP (60) as shown in FIG. 4B. For example, second pre-processing voltage ($EBPV_2$) data can be established on the EBP (60, 60', or 60), and the EPEB wafer (14) can have one or more second wafer voltages ($WV_2$) associated therewith when the EPEB wafer (14) is positioned on top of the small wafer supports (69) during the second pre-processing time ($t_{p2}$). In addition, a second temperature profile ($TP_2$) can be established for the EBP (60, 60', or 60) during the second pre-processing time ($t_{p2}$), and second input power ($IP_2$) can be provided to at least one of the heating elements embedded in the EBP (60, 60', or 60) during the second pre-processing time ($t_{p2}$). Furthermore, the shutter (68) and/or the supply ring (66) can be configured in a first position, thereby establishing an open state for the processing chamber (51') during the second pre-processing time ($t_{p2}$).

In 725, initial measured voltage (IMV) data can be calculated and/or measured for the EPEB wafer during the first and/or second pre-processing times. During some EPEB procedures, first pre-processing voltage profiles ($EBPV_1$) can be measured on the EBP (60, 60', or 60) using the electrodes (62, 62', or 62") and the power supply subsystem (95) during the first pre-processing time ($t_{p1}$). First wafer voltage ($WV_1$) data associated the EPEB wafer (14) can be measured when the EPEB wafer (14) is positioned on top of the lift pins (61) during the first pre-processing time ($t_{p1}$). For example, the initial measured voltage (IMV) data can be calculated using virtual sensors that mathematically model performance.

During some EPEB procedures, second pre-processing voltage ($EBPV_2$) data can be measured on the EBP (60, 60', or 60) using the electrodes (62, 62', or 62") and the power supply subsystem (95) during the second pre-processing time ($t_{p2}$). Second wafer voltage ($WV_2$) data associated the EPEB wafer (14) can be measured when the EPEB wafer (14) is positioned on top of the small wafer supports (69) during the second pre-processing time ($t_{p2}$). A gap (89) can be established between the bottom of the EPEB wafer and the upper surface of the EBP (60) as shown in FIG. 4B, and gap voltage (GV) data can be determined for the gap (89). For example, the gap (89) can comprise a processing gas, which can include air. In addition, the ($EBPV_2$) data, the ($WV_2$) data, and or the (GV) data can be calculated using virtual sensors that mathematically model performance.

In some EPEB procedures, uniform (constant) voltage profiles are required on the EBP (60, 60', or 60), during the first and/or second pre-processing times. In other EPEB procedures, non-uniform (variable) voltage profiles are required on the EBP (60, 60', or 60), during the first and/or second pre-processing times. For example, the power supply subsystem (95) and/or the electrode (62) can provide some of the initial measured voltage (IMV) data. In addition, the sensors (64) can be used to provide voltage and/or temperature data. Alternatively, the lift pins (61) may provide some curvature, voltage, and/or temperature data.

In 730, a first initial query can be performed to determine if the initial measured voltage (IMV) data is within initial processing limits for the EPEB wafer and/or the EBP during the pre-processing times associated with EPEB procedure 700. When the initial measured voltage (IMV) data is within one or more of the initial processing limits for the EPEB wafer and/or the EPEB procedure during the first and second pre-processing times, the EPEB procedure 700 can branch to 740 and can continue as shown in FIG. 7, and when the initial measured voltage (IMV) data is not within at least one of the initial processing limits for the EPEB wafer and/or the EPEB procedure during the first and/or second pre-processing times, the EPEB procedure 700 can branch to 735 and can continue as shown in FIG. 7.

In 735, a second initial query can be performed to determine if corrective actions can be performed to create new initial voltage data that are within initial processing limits for the EPEB procedure 700. When corrective actions can be performed to create new initial processing voltage data that are within one or more of the initial processing limits for the EPEB procedure, the EPEB procedure 700 can branch to 740 and can continue as shown in FIG. 7, and when corrective actions cannot be performed to create new initial processing voltage data that are within at least one of the initial processing limits for the EPEB procedure, the EPEB procedure 700 can branch to 765 and can be stopped as shown in FIG. 7.

During various corrective actions, new first voltages can be provided to one or more of the small wafer supports electrodes (69); new second voltages can be provided to the electrodes (62, 62', or 62"); new uniformity limits can be established for the desired voltage profile data ($dEBPV_n$); new temperature values can be established for the EBP (60, 60', or 60"); and the exposed (selected) wafer (14) can be positioned on the EBP when the corrective action is performed. For example, new voltages can be provided to the electrode (62, 62', or 62") and/or the small wafer supports (69) when a corrective action is performed. In addition, a new desired EBP temperature profile can be established for the EBP and/or a new input power can be provided to at least one of the heater elements (63) embedded in the EBP when a corrective action is performed.

During some corrective actions, one or more new first voltage profiles ($EBPV_1$) can be established and/or measured on the EBP (60, 60', or 60) using the electrodes (62, 62', or 62") and the power supply subsystem (95) during the first pre-processing time ($t_{p1}$). In addition, one or more new first wafer voltages ($WV_1$) associated the EPEB wafer (14) can be established and/or measured when the EPEB wafer (14) is positioned on top of the lift pins (61) during the first pre-processing time ($t_{p1}$).

During other corrective actions, new second pre-processing voltage (NEBPV$_2$) data (profiles) can be established and/or measured on the EBP (60, 60', or 60) using the electrodes (62, 62', or 62") and the power supply subsystem (95) during the second pre-processing time ($t_{p2}$). New second wafer voltage (NWV$_2$) data (profiles) associated the EPEB wafer (14) can be established and/or measured when the EPEB wafer (14) is positioned on top of the small wafer supports (69) during the second pre-processing time ($t_{p2}$). In addition, a gap (89) can be established between the bottom of the EPEB wafer and the upper surface of the EBP (60) as shown in FIG. 4B, and new gap voltage (NGV) data can be established and/or measured for the gap (89).

Figure 4C:
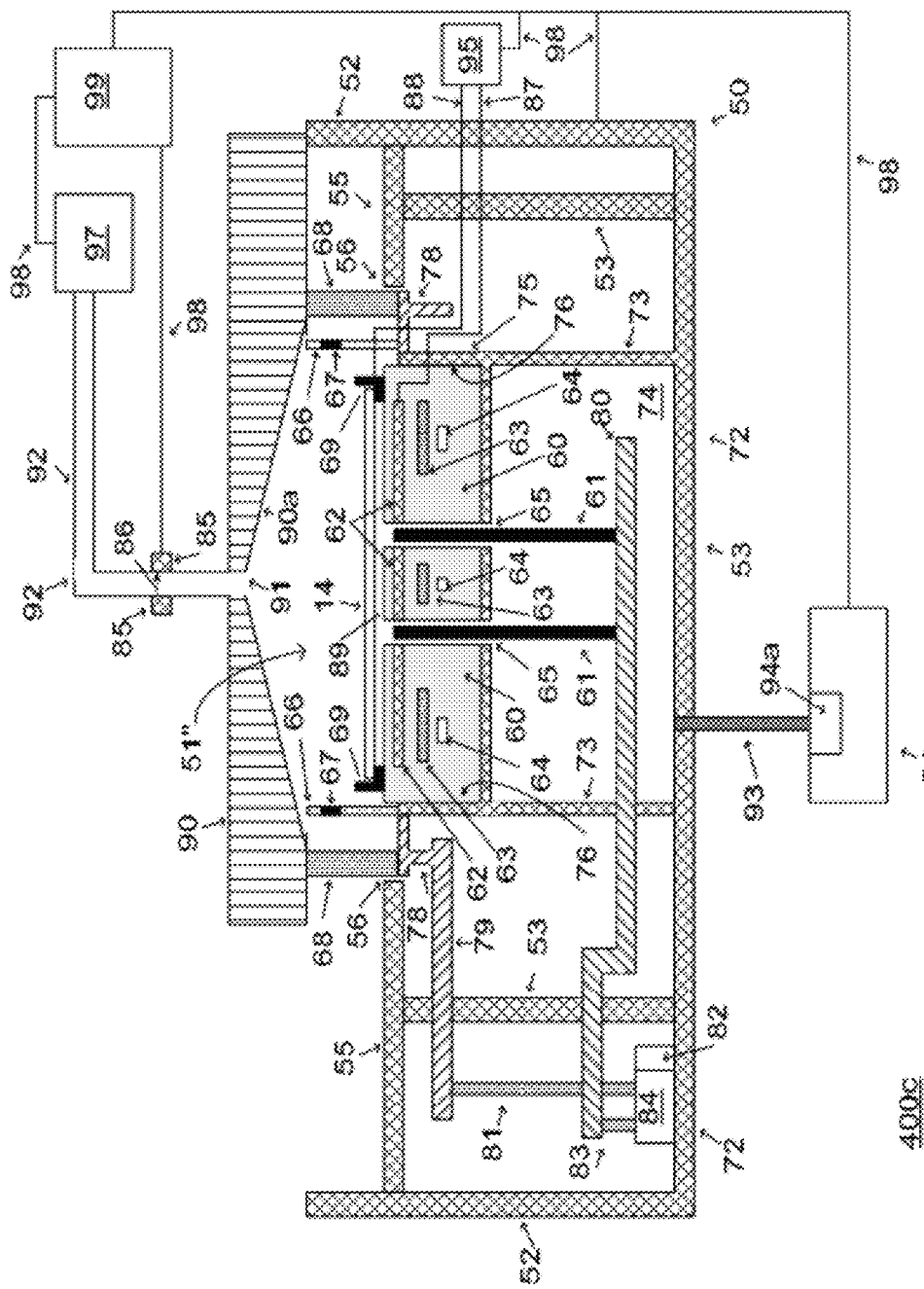

When the correct initial measured voltage (IMV) data has been established, the processing chamber (50") can be closed as shown in FIG. 4C. During a third pre-processing time ($t_{p3}$), the processing chamber (51") can be closed after the EPEB wafer is positioned on the EBP (60, 60', 60") and the correct initial measured voltage (IMV) data (profiles) have been established for the EBP and/or for the EPEB wafer. The shutter (68) and/or the one supply ring (66) can be configured in a second position proximate a bottom surface of a bake lid cover assembly (90), thereby closing the processing chamber (51") during the third pre-processing time ($t_{p3}$) in the EPEB processing time. Initial pre-processing data can be obtained for the EPEB wafers, and the initial pre-processing data can include exposure data, particle data, and/or optical metrology data that can be used in the EPEB procedure.

In 740, new wafer voltage (NWV) data (profiles) can be established for the EPEB wafer in the "closed" processing chamber (51") during the processing times ($t_n$) associated with the EPEB procedure. For example, the EPEB wafer can be positioned on the EBP (60, 60', or 60") that is configured in the EPEB subsystem (50) during the EPEB processing times ($t_n$). The EPEB procedure data, the initial measured voltage (IMV) data, the initial metrology data, the initial inspection data, and/or the exposure data can be used to determine the new wafer voltage (NWV) data (profiles) for each of the EPEB wafers, and the EPEB subsystem (50) and the power supply subsystem (95) can be used to establish the new wafer voltage (NWV) data (profiles).

In some examples, new EBP processing voltage (NEBPV$_n$) data (profiles) can be provided to the electrodes (62) by the power supply subsystem (95) using the first control line (87) during the EPEB processing times ($t_n$). In other examples, new wafer voltage (NWV$_n$) data (profiles) can be provided to one or more of the small wafer supports (69) by the power supply subsystem (95) using the second control line (88) during the EPEB processing times ($t_n$). In still other examples, the power supply subsystem (95) can provide the (NEBPV$_n$) data (profiles) to the electrodes (62), and can provide the (NWV$_n$) data (profiles) to the small wafer supports (69) during the EPEB processing times ($t_n$). In addition, a gap (89) can be established between the bottom of the EPEB wafer and the upper surface of the EBP (60), and new gap voltage (GV$_n$) data (profiles) can be determined and/or established for the gap (89) during the EPEB processing times ($t_n$). Furthermore, the polarity for the new EBP processing voltage (NEBPV$_n$) data (profiles) can be opposite from the polarity of the initial EBP processing voltage (IEBPV) data (profiles).

In 745, new processing voltage (PV$_n$) data can be obtained for EPEB wafer during the EPEB processing times ($t_n$). During some EPEB procedures, new measured EBP voltage (NMEBPV$_n$) data can be calculated and/or measured for the EBP (60, 60', or 60") using the electrodes (62, 62', or 62") and the power supply subsystem (95) during the new EPEB processing times ($t_n$). New measured wafer voltage (NMWV$_n$) data associated the EPEB wafer (14) can be calculated and/or measured when the EPEB wafer is positioned on top of the small wafer supports (69) in the closed processing chamber (51") during the new processing times ($t_n$). In addition, a gap (89) can be established between the bottom of the EPEB wafer and the upper surface of the EBP (60, 60', or 60"), and new measured gap voltage (NMGV$_n$) data (profiles) can be calculated and/or measured for the gap (89) during the EPEB processing times ($t_n$).

In some EPEB procedures, uniform (constant) voltage profiles can be required on the EBP (60, 60', or 60"), during the new processing times ($t_n$). In other EPEB procedures, non-uniform (variable) voltage profiles are required on the EBP (60, 60', or 60"), during the new processing times ($t_n$). For example, the power supply subsystem (95) and/or the electrode (62) can provide some of the measured voltage data during the new processing times ($t_n$). In addition, the sensors (64) can be used to provide voltage and/or temperature data during the new processing times ($t_n$). Furthermore, some of the new processing voltage (PV$_n$) data can be calculated using virtual sensors that mathematically model performance. Alternatively, the lift pins (61) may provide some initial curvature, voltage, and/or temperature data during some EPEB procedures.

The voltage profiles (945a and 945b, FIG. 9) for the wafer and/or the EBP profiles (915a and 915b, FIG. 9) can have a concave shape, a convex shape, or a substantially flat shape. For example, the EBP voltage can vary from about −200 volts to about +300 volts during the EPEB procedures, and the EBP voltage differences between the center and edge can vary from about −5 volts to about +5 volts during the EPEB procedures. In addition, the temperature profiles for the wafer and/or the EBP can have a concave shape, a convex shape, or a substantially flat shape. For example, the wafer temperature and/or the EBP temperature can vary from about 80° Celsius to about 250° Celsius during the EPEB procedures, and the temperature differences between the center and edge temperatures can vary from about 2° Celsius to about 20° Celsius during the EPEB procedures.

In 750 one or more new queries can be performed to determine if the new processing voltage (PV$_n$) data is within new processing limits for the EPEB wafer. When the new processing voltage (PV$_n$) data is within one or more of the new processing limits for the EPEB wafer during the new processing times ($t_n$), the EPEB procedure 700 can branch to 760 and can continue as shown in FIG. 7, and when the new processing voltage (PV$_n$) data is not within at least one of the new processing limits for the EPEB wafer during the new processing times ($t_n$), procedure 700 can branch to 755 and can continue as shown in FIG. 7.

During some EPEB procedures, the new queries can be performed to determine if the new measured EBP voltage (NMEBPV$_n$) data is within the new EBP voltage limits for the EPEB wafer. During other EPEB procedures, the new queries can be performed to determine if the new measured wafer voltage (NMWV$_n$) data is within the new wafer voltage limits for the EPEB wafer.

In 755, one or more additional queries can be performed to determine if corrective actions can be performed to create additional new processing voltage data that are within additional new processing limits for the EPEB procedure 700. When corrective actions can be performed to create additional new processing voltage data that are within one or more of the additional new processing limits for the EPEB procedure, the EPEB procedure 700 can branch to 760 and can continue as shown in FIG. 7, and when corrective actions cannot be performed to create additional new processing voltage data that are within at least one of the additional new processing limits for the EPEB procedure, the EPEB procedure 700 can branch to 765 and can be stopped as shown in FIG. 7.

During various corrective actions performed during the new processing times ($t_n$), new first voltages can be provided to one or more of the electrodes (62, 62', or 62"); new second voltages can be provided to the small wafer supports electrodes (69); new uniformity limits can be established for the desired EBP voltage data ($EBPV_n$); new temperature values can be established for the EBP (60, 60', or 60"); and the wafer (14) can be positioned on the EBP when the corrective action is performed. New wafer voltage ($WV_n$) data can be established for the EPEB wafer when a corrective action is performed. For example, a new wafer temperature profile can be established using the EBP and/or a new input power can be provided to at least one of the heater elements (63) embedded in the EBP when a corrective action is performed. In addition, new gap voltages can be determined for the gap (89) during the corrective actions.

In 760, the EPEB wafer can be "processed" using the new processing voltage data during a first number (N) of the EPEB processing times ($t_n = t_1, t_2, -t_N$) in the EPEB procedure. When processing chamber (51") is closed, the EPEB wafer can be positioned on the small wafer supports (69) above the EBP. For example, the shutter (68) and/or the supply ring (66) can be configured in a second position, thereby establishing a closed state for the processing chamber (51") during these "remaining portions" of the EPEB processing time in the EPEB procedure.

During each of the EPEB processing times ($t_n = t_1, t_2, -t_N$) in the EPEB procedure, a plurality of new activated (acid) species (966b, FIG. 9B) can be created and moved through the developable masking layer material in the developed regions (963b, FIG. 9B) using the new voltage data.

In some examples, new measured EBP voltage ($NMEBPV_n$) data (profiles) can be established on the EBP (60, 60', or 60) during each of the EPEB processing times ($t_n = t_1, t_2, -t_N$) in the EPEB procedure to create and/or move the new activated (acid) species (966b, FIG. 9B) through the developed regions (963b, FIG. 9B). In addition, new measured wafer voltage ($NMWV_n$) data (profiles) can be established on the EPEB wafer during each of the EPEB processing times ($t_n = t_1, t_2, -t_N$) in the EPEB procedure to create and/or move the new activated (acid) species (966b, FIG. 9B) through the developed regions (963b, FIG. 9B). Furthermore, new measured gap voltage ($NMGV_n$) data (profiles) can be established for the gap (89) during each of the EPEB processing times ($t_n = t_1, t_2, -t_N$) in the EPEB procedure to create and/or move the new activated (acid) species (966b, FIG. 9B) through the developed regions (963b, FIG. 9B).

In other examples, new measured EBP voltage ($NMEBPV_n$) data (profiles) may not be required and/or established on the EBP (60, 60', or 60) during each of the EPEB processing times ($t_n = t_1, t_2, -t_N$) in the EPEB procedure to create and/or move the new activated (acid) species (966b, FIG. 9B) through the developed regions (963b, FIG. 9B). In addition, new measured wafer voltage ($NMWV_n$) data (profiles) may not be required and/or established on the EPEB wafer during each of the EPEB processing times ($t_n = t_1, t_2, -t_N$) in the EPEB procedure to create and/or move the new activated (acid) species (966b, FIG. 9B) through the developed regions (963b, FIG. 9B). Furthermore, new measured gap voltage ($NMGV_n$) data (profiles) may not be required and/or established for the gap (89) during each of the EPEB processing times ($t_n = t_1, t_2, -t_N$) in the EPEB procedure to create and/or move the new activated (acid) species (966b, FIG. 9B) through the developed regions (963b, FIG. 9B).

During some procedures, at least the first measured wafer voltage ($MWV_1$) data can be obtained at the first processing (measurement) time ($t_1$) during the processing times ($t_n = t_1, t_2, -t_N$), and additional measured wafer voltage ($MWV_n$) data can be obtained at the $n^{th}$ processing (measurement) time ($t_n$) during the EPEB processing time. In some embodiments, the total processing time ($t_{Proc}$) for the EPEB procedure can vary from about 50 seconds to about 300 seconds. When a new measured wafer voltage ($NMWV_n$) data is obtained for the wafer during EPEB procedure, the processing (measurement) times ($t_n$), and an integer counting variable (n) can be incremented. For example, the integer counting variable (n) can vary from one to an integer value greater than ten. In addition, the measured wafer voltage ($MWV_n$) data and the associated processing (measurement) time ($t_n$) can be stored and/or compared to historical data previously obtained for the first EPEB procedure and/or associated wafer.

In some cases, the current value for the integer counting variable (n) can be compared to the first number (N) of processing (measurement) times. When the current value for the integer counting variable (n) is less than or equal to the first number (N) of processing (measurement) times, the EPEB procedure 700 can continue, and when the current value for the integer counting variable (n) is greater than the first number (N) of processing (measurement) times, the EPEB procedure branch to 765 and can end.

In 765, the EPEB procedure can be stopped.

When a plurality of wafers requires processing, procedure 700 can be repeated as required to process the plurality of wafers. In addition, when a new wafer is required, a new wafer can be selected and procedure 700 can be repeated for the new wafer.

After some of the EPEB procedures, one or more of the processed (developed) wafers can be transferred from the EPEB processing subsystem (50) to an inspection module or an optical measurement module that can be configured in the coating/developing processing system 1 illustrated in FIGS. 1-3. For example, post-processing inspection data and/or optical metrology data can be obtained for one or more of the processed (developed) wafers, and the post-processing data can be used to verify and/or update the EPEB procedure.

In some embodiments, the temperature profiles for the wafer and/or the EBP (60, 60') can be established using at least one heating elements (63, 515, 525, and 535) embedded in the EBP (60, 60'), and at least one sensor (64) can be embedded in the EBP (60, 60') and can be used to determine the temperature profile for the wafer and/or the EBP (60, 60').

In other embodiments, the temperature profiles for the wafer and/or the EBP (60, 60', 60") can be established using one or more of the first multi-segmented resistance heaters (615a, 615b, 615c and 615d) in the first multi-section circular (annular) segments (610a, 610b, 610c, and 610d) in the EBP (60"); using one or more of the second multi-segmented resistance heaters (625a, 625b, 625c and 625d) in the second multi-section circular (annular) segments (620a, 620b, 620c, and 620d) in the EBP 60"; and/or using one or more of the third multi-segmented resistance heaters (635a, 635b, 635c and 635d) in the third multi-section circular (annular) segments (630a, 630b, 630c, and 630d) in the EBP (60"). In addition, at least one sensor (64) embedded in the EBP (60") and can be used to determine the temperature profiles for the wafer and/or the EBP (60").

In some examples, the one or more corrective procedures can be performed when the wafer is not on the EBP (60, 60', 60"), or when the incorrect layer has been exposed on the wafer, or when a deposited layer has not been exposed. For example, when the wafer is not on the EBP (60, 60', 60"), the heating can be stopped to prevent damage to the EBP; when a deposited layer has not been exposed, the heating can be stopped to prevent damage to the wafer and/or the EBP; and when the incorrect layer has been exposed on the wafer, the heating can be stopped, the wafer can be removed from the EBP and the wafer can be reworked. In addition, the processing chamber (51) can remain open when the EPEB procedure is stopped.

FIG. 8 shows a simplified process flow diagram for another exemplary method of processing a wafer using an EPEB teaching procedure in accordance with embodiments of the invention. An EPEB teaching procedure can be determined for each wafer using historical and/or real-time data. In the illustrated embodiment shown in FIG. 8, an exemplary EPEB teaching procedure 800 is shown that can be used to process one or more EPEB teaching wafers using an EPEB processing systems (400a and 400b). In addition, the EPEB teaching procedure 800 represents an exemplary method for teaching, operating, and/or controlling the EPEB subsystem (50) and the power supply subsystems (95) that are configured in the EPEB processing systems (400a and 400b). For example, one or more exposed substrate/wafers can be processed using one or EPEB subsystems (50) and one or more power supply subsystems (95) configured in the coating/developing processing system 1, illustrated in FIGS. 1-3.

The EPEB teaching wafers can have one or more exposed masking layers thereon, and at least one of the masking layers can comprise a patterned latent image that includes a pattern of activated regions having activated species therein. The substrate/wafer can include semiconductor material, ceramic material, metallic material, dielectric material, doped material, stressed material, strained material, carbon material, glass material, Anti-Reflective Coating (ARC) material, Bottom Anti-Reflective Coating (BARC) material, or Top Anti-Reflective Coating (TARC) material, or any combination thereof. The masking layers can include dual-tone resist material, freezable or frozen resist material, hardened resist material, Ultra-Violet (UV) resist material, Extreme Ultra-Violet (EUV) resist material, organic material, or non-organic material or any combination thereof.

In some embodiments, EPEB teaching procedure data can be determined for a first set of EPEB teaching wafers that are to be processed using the EPEB processing systems (400a and 400b) during the EPEB teaching procedure. The EPEB teaching procedure can be determined for each of the EPEB teaching wafers using historical and/or real-time data. For example, the EPEB teaching wafers can include an exposed masking layer on top of other layers, and the masking layer can include dual-tone resist material, freezable or frozen resist material, hardened resist material, Ultra-Violet (UV) resist material, Extreme Ultra-Violet (EUV) resist material, organic material, or non-organic material, or any combination thereof. In addition, the other layers can include Anti-Reflective Coating (ARC) material, Bottom Anti-Reflective Coating (BARC) material, Top Anti-Reflective Coating (TARC) material, semiconductor material, ceramic material, metallic material, dielectric material, doped material, stressed material, strained material, carbon material, or glass material, or any combination thereof.

Initialization data can be established for the EPEB teaching procedure. For example, a first counting variable (n) and a teaching limit ($T_N$) can be established for the teaching times ($t_n$); the first counting variable (n) can have an integer value greater than zero, and the teaching limit ($T_N$) can be an integer having a value greater than ten. In addition, a second counting variable (m) and a counting limit ($M_T$) can be established for the EPEB teaching wafers ($TW_m$); the second counting variable (m) can have an integer value greater than zero; and the counting limit ($M_T$) can be an integer having a value greater than two. Alternatively, the teaching limit ($T_N$) and/or the counting limit ($M_T$) may have different values. In some examples, the teaching times ($t_n$) can be used to illustrate time points, and in other examples, the teaching times ($t_n$) can be used to illustrate periods of time. In various embodiments, the total teaching time ($T_{Teach}$) for an EPEB teaching procedure can vary from about 50 seconds to about 300 seconds.

In 810, the EPEB teaching wafer ($TW_m$) can be transferred from an exposure system to an EBP (60, 60', or 60) in the EPEB subsystem (50) that can be configured in the coating/developing processing system 1 illustrated in FIGS. 1-3. The EPEB teaching wafer (14) can comprise an exposed masking layer (960a, FIG. 9A) that includes an exposed (latent) image having exposed regions (963a, FIG. 9A) and unexposed regions (962a, FIG. 9A), and the exposed regions (963a, FIG. 9A) can include a plurality of first activated species (966a, FIG. 9A). For example, the exposed regions (963a, FIG. 9A) can include developable masking layer material, and unexposed regions (962a, FIG. 9A) can include un-developable masking layer material.

During a transfer time ($t_T$) in the EPEB teaching procedure, the lift pins (61) can be in the first "up/transfer" position, and the EPEB teaching wafer (14) that requires "developing" can be in a "transfer" position on top of the lift pins (61) as shown in FIG. 4A.

For example, first pre-processing voltage ($EBPV_1$) data can be established on the EBP (60, 60', or 60), and the EPEB teaching wafer (14) can have one or more first wafer voltages ($WV_1$) associated therewith when the EPEB teaching wafer (14) is positioned on top of the lift pins (61) as shown in FIG. 4A. In addition, a first temperature profile ($TP_1$) can be established for the EBP (60, 60', or 60) during the first pre-processing time ($t_{p1}$), and first input power ($IP_1$) can be provided to at least one of the heating elements embedded in the EBP (60, 60', or 60) during the first pre-processing time ($t_{p1}$).

In 815, initial teaching voltage data can be established for the EBP (60, 60', or 60") that can be configured in the EPEB subsystem (50) during a pre-processing time in an EPEB teaching procedure. The EPEB teaching procedure data and/or the exposure data can be used to determine the initial voltage data for the EPEB teaching wafers, and the EPEB subsystem (50) and the power supply subsystem (95) can be used to establish the initial teaching voltage data.

In some examples, one or more initial EBP voltage profiles can be provided to one or more of the electrodes (62) by the power supply subsystem (95) using the first control line (87) during the pre-processing time in the EPEB teaching procedure. In other examples, one or more initial wafer voltage profiles can be provided to the small wafer supports (69) by the power supply subsystem (95) using the second control line (88) during the pre-processing time in the EPEB teaching procedure. In still other examples, the power supply subsystem (95) can provide one or more initial wafer voltage profiles to the electrodes (62), and can provide one or more initial wafer voltage profiles to the small wafer supports (69) during the pre-processing time in the EPEB teaching procedure.

During the EPEB teaching procedure, a plurality of new activated species (966b, FIG. 9B) can be created and moved through the developable masking layer material in the developed regions (963b, FIG. 9B). For example, new voltage profiles can be established on the EBP (60, 60', or 60") to create and/or move the new activated (acid) species (966b, FIG. 9B) through the developed regions (963b, FIG. 9B).

During a pre-processing time ($t_{p1}$) in the EPEB teaching procedure, the lift pins (61) can be in a "down" position, and the EPEB teaching wafer ($TW_m$) that requires "developing" can be in a "processing" position on top of the small wafer supports (69) above the upper surface of the EBP (60) as shown in FIG. 4B. In addition, a gap (89) can be established between the bottom of the EPEB teaching wafer ($TW_m$) and the upper surface of the EBP (60). Pre-processing teaching voltage (TEBPV) data can be established on the EBP (60, 60', or 60"), and the EPEB teaching wafer ($TW_m$) can have initial teaching wafer voltage (ITWV) data associated therewith when the EPEB teaching wafer ($TW_m$) is positioned on top of the small wafer supports (69) during the pre-processing time. For example, gap voltages can be determined for the gap (89) during the pre-processing time ($t_{p1}$). In addition, an initial temperature profile ($TP_1$) can be established for the EBP (60, 60', or 60") during the pre-processing time ($t_{p1}$), and initial input power ($IP_1$) can be provided to at least one of the heating elements embedded in the EBP (60, 60', or 60") during the pre-processing time ($t_{p1}$). Furthermore, the shutter (68) and/or the supply ring (66) can be configured in a first position, thereby establishing an open state for the processing chamber (51') during the pre-processing time ($t_{p1}$) in the EPEB teaching procedure.

In 820, initial measured teaching wafer voltage (IMTWV) data can be obtained for each of the EPEB teaching wafer ($TW_m$) during the pre-processing time ($t_{p1}$). During some EPEB teaching procedures, initial measured pre-processing teaching voltage (IMEBPTV) data can be calculated and/or measured on the EBP (60, 60', or 60") using the electrodes (62, 62', or 62") and the power supply subsystem (95) during the pre-processing time ($t_1$). The initial measured teaching wafer voltage (IMTWV) data associated the EPEB teaching wafer ($TW_m$) can be calculated and/or measured when the EPEB teaching wafer ($TW_m$) is positioned on top of the small wafer supports (69) during the pre-processing time ($t_1$). In addition, measured gap voltage (MGV) data can be measured and/or calculated for the gap (89) during the pre-processing time ($t_1$) in the EPEB teaching procedures. In addition, the (IMEBPV) data, the (IMTWV) data, and or the (MGV) data can be calculated using virtual sensors that mathematically model performance.

In some EPEB teaching procedures, uniform (constant) voltage profiles can be required on the EBP (60, 60', or 60"), during the pre-processing time ($t_1$). In other EPEB teaching procedures, non-uniform (variable) voltage profiles can be required on the EBP (60, 60', or 60"), during the pre-processing time ($t_1$). For example, the power supply subsystem (95) and/or the electrode (62) can provide some of the initial measured teaching voltage (IMTV) data. In addition, the sensors (64) can be used to provide voltage and/or temperature data, the lift pins (61) and/or the small wafer supports (69) may provide some curvature, voltage, and/or temperature data during the pre-processing time ($t_1$).

In 825, a first initial query can be performed to determine if the initial measured teaching voltage (IMTV) data is within initial teaching limits for the teaching wafer ($TW_m$) in the EPEB teaching procedure 800. When the initial measured teaching voltage (IMTV) is within one or more of the initial teaching limits for the EPEB teaching wafer ($TW_m$) during the pre-processing time ($t_1$), the EPEB teaching procedure 800 can branch to 830 and can continue as shown in FIG. 8, and when the initial measured teaching voltage (IMTV) is not within at least one of the initial teaching limits for the EPEB teaching wafer ($TW_m$) during the pre-processing time, the EPEB teaching procedure 800 can branch to 835 and can continue as shown in FIG. 8.

During some EPEB procedures, the new initial queries can be performed to determine if the initial measured EBP voltage (IMEBPTV) data is within the initial EBP voltage limits for the EPEB wafer. During other EPEB procedures, the new initial queries can be performed to determine if the initial measured wafer teaching voltage (IMWTV) data is within the new wafer voltage limits for the EPEB wafer.

In 830, a second initial query can be performed to determine if new initial teaching limits can be established for the EPEB teaching wafer ($TW_m$) during the pre-processing time ($t_{p1}$), teaching voltage data that are within for the first EPEB teaching procedure 800. When corrective actions can be performed to create new initial teaching limits for the EPEB teaching wafer ($TW_m$), the EPEB teaching procedure 800 can branch back to 815 and can continue as shown in FIG. 8 after new initial teaching limits have been created. When corrective actions cannot be performed to create new initial teaching limits for the EPEB teaching wafer ($TW_m$), the EPEB teaching procedure 800 can branch to 885 and ends as shown in FIG. 8. For example, corrective actions can be performed to prevent damage to the EBP and/or the teaching wafer. In addition, the EPEB teaching procedure can be stopped, and the processing chamber (51") can be opened when the corrective actions are performed to prevent damage to the EBP and/or the teaching wafer; the teaching wafer can be removed from the EBP, and the exposed teaching wafer can be reworked.

During various corrective actions, new first voltages can be provided to one or more of the small wafer supports electrodes (69); new second voltages can be provided to the electrodes (62, 62', or 62"); new uniformity limits can be established for the initial measured teaching wafer voltage (IMTWV) data; new gap voltages can be determined and/or established; new temperature values can be established for the EBP (60, 60', or 60"); and the exposed (selected) wafer (14) can be positioned on the EBP when the corrective action is performed. For example, new voltages can be provided to the electrode (62, 62', or 62") and/or the small wafer supports (69) when a corrective action is performed. In addition, a new desired EBP temperature profile can be established for the EBP and/or a new input power can be provided to at least one of the heater elements (63) embedded in the EBP when a corrective action is performed.

During some teaching procedures, additional initial teaching wafer voltage data associated the EPEB teaching wafer ($TW_m$) can be established and/or measured when the EPEB teaching wafer ($TW_m$) is positioned on top of the lift pins (61) during the initial teaching time ($t_{ti}$).

When the correct initial measured teaching voltage (IMTV) data has been established, the processing chamber (50) can be closed as shown in FIG. 4C. During the initial teaching time ($t_{ti}$), the processing chamber (51") can be closed after the EPEB teaching wafer ($TW_m$) is positioned on the EBP (60, 60', 60") and the correct initial voltage profiles been established for EBP and/or the EPEB teaching wafer. The shutter (68) and/or the one supply ring (66) can be configured in a second position proximate a bottom surface of a bake lid cover assembly (90), thereby closing the processing chamber (51) during the new teaching times ($t_n$) in the EPEB teaching procedure. The initial teaching data for the EPEB teaching wafer ($TW_m$) can include exposure data, inspection data, and/or metrology data that can be used in the EPEB teaching procedure.

In 835, the initial measured teaching voltage (IMTV) data and the associated initial teaching (measurement) time ($t_n$) can be stored in an EPEB-related database or library. During some storage procedures, the initial measured teaching voltage (IMTV) data can be compared to the historical data already stored in the EPEB-related database or library to minimize storage space.

In 840, new teaching wafer voltage ($NTWV_n$) data can be established for the EPEB teaching wafer ($TW_m$) in the "closed" processing chamber (51") during the teaching times ($t_n$) associated with the EPEB teaching procedure. The EPEB teaching wafer ($TW_m$) can be positioned on the EBP (60, 60', or 60") that is configured in the EPEB subsystem (50) during the new EPEB teaching times (4), and the EPEB teaching wafer can be "processed" using the new teaching wafer voltage ($NTWV_n$) data during each of the EPEB teaching times ($t_n$) in the EPEB teaching procedure. For example, the polarity for the new teaching wafer voltage ($NTWV_n$) can be opposite from the polarity of the initial teaching wafer voltage (ITWV) data.

The EPEB procedure data, the initial voltage data, and/or the exposure data can be used to determine the new teaching voltage ($NTV_n$) data for each of the EPEB teaching wafers ($TW_m$), and the EPEB subsystem (50) and the power supply subsystem (95) can be used to establish and/or provide the new teaching voltage ($NTV_n$) data.

In some examples, new EBP teaching voltage ($NEBPTV_n$) data (profiles) can be provided to the electrodes (62) by the power supply subsystem (95) using the first control line (87) during the new EPEB teaching times ($t_n$). For example, the polarity for the new EBP teaching voltage ($NEBPTV_n$) data (profiles) can be opposite from the polarity of the initial EBP teaching voltage (IEBPTV) data (profiles). In other examples, new teaching wafer voltage ($NTWV_n$) data (profiles) can be provided to one or more of the small wafer supports (69) by the power supply subsystem (95) using the second control line (88) during the new EPEB teaching times ($t_n$). For example, the polarity for the new teaching wafer voltage ($NTWV_n$) data (profile) can be opposite from the polarity of the initial teaching voltage (ITV). In still other examples, the power supply subsystem (95) can provide new EBP teaching voltage ($NEBPTV_n$) data (profiles) to the electrodes (62), and can provide new teaching wafer voltage ($NTWV_n$) data (profiles) to the small wafer supports (69) during the EPEB new teaching times ($t_n$).

In some embodiments, new measured EBP teaching voltage ($NMEBPTV_n$) data can be obtained from the electrodes (62) by the power supply subsystem (95) using the first control line (87) during the new EPEB teaching times ($t_n$). For example, the polarity for the new measured EBP teaching voltage ($NMEBPTV_n$) data can be opposite from the polarity of the initial measured EBP teaching voltage (IMEBPTV) data. In other examples, new measured teaching wafer voltage ($NMTWV_n$) data can be obtained from one or more of the small wafer supports (69) by the power supply subsystem (95) using the second control line (88) during the new EPEB teaching times ($t_n$). In still other examples, the power supply subsystem (95) can obtain new measured EBP teaching voltage ($NMEBPTV_n$) data from the electrodes (62), and can obtain new measured teaching wafer voltage ($NMTWV_n$) data from the small wafer supports (69) during the EPEB new teaching times ($t_n$). The new measured teaching voltage ($NMTWV_n$) data and/or the new measured EBP teaching voltages ($NMEBPTV_n$) can be obtained for EPEB teaching wafer ($TW_m$) when the EPEB teaching wafer ($TW_m$) is positioned on top of the small wafer supports (69) in the closed processing chamber (51") during the new teaching times ($t_n$). Alternatively, the small wafer supports (69) may be replaced by a spacer.

In some EPEB teaching procedures, uniform (constant) measured voltage profiles can be required on the EBP (60, 60', or 60) during the new teaching times ($t_n$). When the EPEB teaching wafer ($TW_m$) has a non-uniform (curved) shape, non-uniform (variable) measured voltage profiles can be required on the EBP (60, 60', or 60) during the new teaching times ($t_n$). For example, the sensors (64) can be used to provide additional voltage and/or temperature data during the new teaching times ($t_n$). In addition, the lift pins (61) may provide some initial curvature, voltage, and/or temperature data during some EPEB teaching procedures.

In 845, one or more new queries can be performed to determine if the new teaching voltage ($TV_n$) data is within new teaching limits for the EPEB teaching wafer. When the new teaching voltage ($TV_n$) data is within one or more of the new teaching limits for the EPEB teaching wafer during the new teaching times ($t_n$), the EPEB procedure 800 can branch to 855 and can continue as shown in FIG. 8, and when the new teaching voltage ($TV_n$) data is not within at least one of the new teaching limits for the EPEB teaching wafer during the new teaching times ($t_n$), procedure 800 can branch to 850 and can continue as shown in FIG. 8.

During some EPEB teaching procedures, a new query can be performed to determine if new measured teaching wafer voltage ($NMTWV_n$) data is within new teaching limits for the selected teaching wafer ($TW_m$) in the EPEB teaching procedure 800. When the new measured teaching wafer voltage ($NMTWV_n$) data is within one or more of the new teaching limits for the EPEB teaching wafer ($TW_m$) during the new teaching time ($t_n$), the EPEB teaching procedure 800 can branch to 855 and can continue as shown in FIG. 8, and when the new measured teaching wafer voltage ($NMTWV_n$) data is not within at least one of the new teaching limits for the EPEB teaching wafer ($TW_m$) during the new teaching time ($t_n$), the EPEB teaching procedure 800 can branch to 850 and can continue as shown in FIG. 8.

During other EPEB teaching procedures, the new query can be performed to determine if new measured teaching wafer voltage ($NMTWV_n$) data is within new teaching limits for the selected teaching wafer ($TW_m$) in the EPEB teaching procedure 800. When the new measured teaching wafer voltage ($NMTWV_n$) data is within one or more of the new teaching limits for the EPEB teaching wafer ($TW_m$) during the new teaching time ($t_n$), the EPEB teaching procedure 800 can branch to 855 and can continue as shown in FIG. 8, and when the new measured teaching wafer voltage ($NMTWV_n$) data is not within at least one of the new teaching limits for the EPEB teaching wafer ($TW_m$) during the new teaching time ($t_n$), the EPEB teaching procedure 800 can branch to 850 and can continue as shown in FIG. 8.

In 850, one or more additional new queries can be performed to determine if new additional teaching limits can be established for the EPEB teaching wafer ($TW_m$) during the new teaching times ($t_n$) in the EPEB teaching procedure 800. When corrective actions can be performed to create new additional teaching limits for the EPEB teaching wafer ($TW_m$), the EPEB teaching procedure 800 can branch back to 840 and can continue as shown in FIG. 8 after the new additional teaching limits have been established. When corrective actions cannot be performed to create new additional teaching limits for the EPEB teaching wafer ($TW_m$), the EPEB teaching procedure 800 can branch to 855 and can continue as shown in FIG. 8. For example, corrective actions can be performed to prevent damage to the EBP and/or the teaching wafer. Alternatively, the EPEB teaching procedure may be stopped, and the processing chamber (51'') may be opened when the corrective actions are performed to prevent damage to the EBP and/or the EPEB teaching wafer ($TW_m$); and the EPEB teaching wafer ($TW_m$) can be removed from the EBP.

During various corrective actions performed during the new teaching times ($t_n$), new first teaching voltages can be provided to one or more of the electrodes (62, 62', or 62''); new second teaching voltages can be provided to the small wafer supports electrodes (69); new teaching uniformity limits can be established for the desired EBP voltage ($EBPV_n$) data; new temperature teaching values can be established for the EBP (60, 60', or 60''); and the teaching wafer (14) can be positioned on the EBP when the corrective action is performed. For example, new wafer temperature profile can be established using the EBP and/or a new input power can be provided to at least one of the heater elements (63) embedded in the EBP when a corrective action is performed.

In 855, the new measured EBP teaching voltage ($NMEBPTV_n$) data and the associated new teaching (measurement) time ($t_n$) can be stored in an EPEB-related database or library. During some storage procedures, the new measured EBP teaching voltages ($NMEBPTV_n$) data can be compared to the historical data already stored in the EPEB-related database or library to minimize the teaching time and/or the required storage space. In addition, the new measured teaching wafer voltage ($NMTWV_n$) data and the associated new teaching (measurement) time ($t_n$) can be stored in an EPEB-related database or library. During some storage procedures, the new measured teaching wafer voltage ($NMTWV_n$) data can be compared to the historical data already stored in the EPEB-related database or library to minimize the teaching time and/or the required storage space.

During each of the EPEB teaching times ($t_n = t_1, t_2, -t_N$) in the EPEB teaching procedure, a plurality of new activated (acid) species (966b, FIG. 9B) can be created and/or moved through the developable masking layer material thereby "developing" the developable masking layer material in the developed regions (963b, FIG. 9B) using the new teaching voltage ($NTV_n$) data.

In some examples, new EBP teaching voltage ($NEBPTV_n$) data (profiles) can be established on the EBP (60, 60', or 60) during each of the EPEB teaching times ($t_n = t_1, t_2, -t_N$) in the EPEB teaching procedure to create and/or move the new activated (acid) species (966b, FIG. 9B) through the developed regions (963b, FIG. 9B). In addition, new measured teaching wafer voltage ($NMTWV_n$) data (profiles) can be established on the EPEB teaching wafer during each of the EPEB teaching times ($t_n = t_1, t_2, -t_N$) in the EPEB teaching procedure to create and/or move the new activated (acid) species (966b, FIG. 9B) through the developed regions (963b, FIG. 9B). Furthermore, new teaching gap voltage ($NTGV_n$) data (profiles) can be established for the gap (89) during each of the EPEB teaching times ($t_n = t_1, t_2, -t_N$) in the EPEB teaching procedure to create and/or move the new activated (acid) species (966b, FIG. 9B) through the developed regions (963b, FIG. 9B).

In other examples, new EBP teaching voltage ($NEBPTV_n$) data (profiles) may not be required and/or established on the EBP (60, 60', or 60) during each of the EPEB teaching times ($t_n = t_1, t_2, -t_N$) in the EPEB teaching procedure to create and/or move the new activated (acid) species (966b, FIG. 9B) through the developed regions (963b, FIG. 9B). In addition, new measured teaching wafer voltage ($NMTWV_n$) data (profiles) may not be required and/or established on the EPEB wafer during each of the EPEB teaching times ($t_n = t_1, t_2, -t_N$) in the EPEB procedure to create and/or move the new activated (acid) species (966b, FIG. 9B) through the developed regions (963b, FIG. 9B). Furthermore, new teaching gap voltage ($NTGV_n$) data (profiles) may not be required and/or established for the gap (89) during each of the EPEB teaching times ($t_n = t_1, t_2, -t_N$) in the EPEB teaching procedure to create and/or move the new activated (acid) species (966b, FIG. 9B) through the developed regions (963b, FIG. 9B).

During some teaching procedures, at least the first measured teaching wafer voltage ($MTWV_1$) data can be obtained at the first teaching (measurement) time ($t_1$) during the teaching times ($t_n = t_1, t_2, -t_N$), and additional measured wafer voltage ($MWV_n$) data can be obtained at the $n^{th}$ teaching (measurement) time ($t_n$) during the EPEB teaching time. In some embodiments, the total teaching time ($t_{Teach}$) for the EPEB teaching procedure can vary from about 50 seconds to about 300 seconds. When a new measured teaching wafer voltage ($NMTWV_n$) data is obtained for the teaching wafer during EPEB teaching procedure, the teaching (measurement) times ($t_n$), and an integer counting variable (n) can be incremented. For example, the integer counting variable (n) can vary from one to an integer value greater than ten. In addition, the measured teaching wafer voltage ($MTWV_n$) data and the associated teaching (measurement) time ($t_n$) can be stored and/or compared to historical data previously obtained for the first EPEB teaching procedure and/or associated teaching wafer.

During the new teaching times ($t_n$), new temperature uniformity limits can be established for the EBP (60, 60', or 60''); new temperature values can be established for the EBP (60, 60', or 60''); a new wafer temperature profile can be established using the EBP and/or new input power can be provided to at least one of the heater elements (63) embedded in the EBP (60, 60', or 60'').

In 860, another query can be performed to determine if the required number ($T_N$) of teaching times ($t_n$) have been performed. When the required number ($T_N$) of teaching times ($t_n$) have not been performed, the teaching procedure 800 can branch back to 840 and proceed as shown in FIG. 8. When the required number ($T_N$) of teaching times ($t_n$) have been performed, the teaching procedure 800 can branch to 865 and proceed as shown in FIG. 8. For example, one or more time constants ($\tau$) can be calculated for the teaching wafer ($TW_m$) and can be used to determine the required number ($T_N$) of teaching times ($t_n$).

In 865, at least one "developed" teaching wafer ($TW_m$) can be transferred to an optical measurement/inspection subsystem after the teaching wafer ($TW_m$) has been "developed" during the EPEB teaching procedure, and post-processing teaching data can be obtained for the teaching wafer ($TW_m$). The post-processing teaching data can include optical digital profile (ODP) data, such as critical dimension (CD) data, sidewall angle (SWA) data, and uniformity data, and optical data, such as refractive index (n) data and extinction coefficient (k) data. For example, CD data and SWA (profile) data can include information for features and open areas (vias) in one or more layers, and can include uniformity data. Alternatively, the teaching wafer ($TW_m$) may not be transferred to the optical measurement/inspection subsystem after the teaching wafer ($TW_m$) has been "developed" during the EPEB teaching procedure, and the post-processing teaching data may be obtained after the EPEB teaching procedure has been performed.

In 870, one or more additional queries can be performed to determine if a new teaching wafer ($TW_m$) is required. When a new teaching wafer ($TW_m$) is required, the counting variable (m) can be incremented, the teaching procedure 800 can branch back to 810 and continue as shown in FIG. 8. When a new teaching wafer (TW$_m$) is not required, the teaching procedure 800 can branch to 875 and end as shown in FIG. 8.

In 875, the teaching procedure 800 can end. For example, one or more etching procedures can be performed after the EPEB teaching procedure.

In various embodiments, different teaching temperature profiles can be established for the EBP (60, 60', or 60") during the different EPEB teaching times (t$_n$). The teaching temperature profiles can have concave shapes, convex shapes, or substantially flat shapes, and the temperatures at the edge of the EBP (60, 60', or 60") can be substantially the same as the temperatures at the center of the EBP. For example, the temperatures for the EBP (60, 60', or 60") can vary from about 80° Celsius to about 250° Celsius during the EPEB teaching times (t$_n$), and the temperature differences between the center and edge temperatures can vary from about 2° Celsius to about 20° Celsius during the EPEB teaching times (t$_n$). In addition, the teaching temperature profiles can be established for the EBP (60, 60', or 60") using at least one heating element (63, 515, 525, and 535) embedded in the EBP (60, 60', or 60"), and at least one sensor (64) can be embedded in the EBP (60, 60', or 60") and can be used to determine the teaching temperature profiles for the EBP (60, 60', or 60") during the EPEB teaching procedures.

In other embodiments, the teaching temperature profiles can be established for the EBP (60, 60', or 60") using one or more of the first multi-segmented resistance heaters (515a, 515b, 515c and 515d) in the first multi-section circular (annular) segments (510a, 510b, 510c, and 510d) in the second EBP (60'); using one or more of the second multi-segmented resistance heaters (525a, 525b, 525c and 525d) in the second multi-section circular (annular) segments (520a, 520b, 520c, and 520d) in the second EBP (60'); and/or using one or more of the third multi-segmented resistance heaters (535a, 535b, 535c and 535d) in the third multi-section circular (annular) segments (530a, 530b, 530c, and 530d) in the second EBP (60'). In addition, at least one sensor (64) embedded in the second EPB (60') and can be used to determine the teaching temperature profiles for the second EBP (60') during the EPEB teaching procedures.

FIGS. 9A and 9B illustrate schematic representations of an exemplary EPEB procedure in accordance with embodiments of the invention. FIG. 9A illustrates a schematic representation of an "undeveloped" processing state 900a in an EPEB procedure (700) or in an EPEB teaching procedure (800), and FIG. 9B illustrates a schematic representation of a "developing" processing state 900b in the EPEB procedure (700) or in the EPEB teaching procedure (800).

FIG. 9A shows a first electrostatic bake plate (EBP) 910a having an electrode 912a that includes a plurality of negative charges 915a to represent a negative voltage profile on the electrode 912a during the "undeveloped" processing state (900a. The "undeveloped" processing state 900a can occur during the pre-processing times in the EPEB procedure (700) and/or during the initial teaching times in the EPEB teaching procedure (800).

In some embodiments, one or more isolation elements 920a can be configured above the top of the first EBP 910a, and the isolation elements 920a can be configured to position the EPEB wafer 960a above the first EBP 910a. For example, isolation elements 920a can be used to form a gap region 925a thereby isolating the EPEB wafer 960a from the first EBP 910a during the EPEB procedure (700) and/or the EPEB teaching procedure (800). For example, the isolation elements 920a can comprise a first dielectric material, and the gap region 925a can comprise a second dielectric material that can include air.

The EPEB wafer 930a can comprise a substrate layer 940a and an exposed masking layer 960a that includes an exposed (latent) image having unexposed regions 962a and exposed regions 963a, and the exposed regions 963a can include a plurality of first charged (activated) species 966a. For example, the exposed regions 963a can include developable masking layer material, and unexposed regions 962a can include un-developable masking layer material.

A first exemplary voltage source 970a is shown in FIG. 9A that can be used to represent the power supply subsystem (95), and can be coupled to the electrode 912a. The first exemplary voltage source 970a can be used to represent a first "biasing" condition for the first EBP 910a and can provide an exemplary initial EBP voltage profile 915a to the exemplary electrode 920a during pre-processing times associated with the EPEB procedure (700) and/or during the initial teaching times associated with the EPEB teaching procedure (800).

In some embodiments, the exemplary initial EBP voltage profile 915a can be represented using a plurality of negative charges as shown in FIG. 9A. Alternatively, the exemplary EBP wafer voltage profile 915a can be represented using a plurality of positive charges (not shown). For example, the polarity of the exemplary EBP voltage profile 915a can be dependent upon the polarity of the first charged (activated) species 966a that are present in the exposed regions 963a, and the first charged (activated) species 966a can be positively charged as shown in FIG. 9A. The polarity of the first charged (activated) species 966a can be dependent upon the masking material in the exposed masking layer 960a.

A second exemplary voltage source 975a is shown in FIG. 9A that can be used to represent the power supply subsystem (95), and can be coupled to one or more of the isolation elements 920a. The second exemplary voltage source 975a can be used to represent a first "biasing" condition for the EPEB wafer 930a and can provide an exemplary initial EBP voltage profile 945a to the EPEB wafer 930a during pre-processing times associated with the EPEB procedure (700) and/or during the initial teaching times associated with the EPEB teaching procedure (800). In other embodiments, the second voltage source 975a can be coupled to the exemplary EPEB wafer 930a and can provide an exemplary initial wafer voltage profile 945a to the exemplary EPEB wafer 930a during pre-processing times associated with the EPEB procedure (700) and/or during the initial teaching times associated with the EPEB teaching procedure (800). In addition, the exemplary initial wafer voltage profile 945a can be represented using a plurality of negative charges as shown in FIG. 9A. Alternatively, the exemplary initial wafer voltage profile 945a can be represented using a plurality of positive charges (not shown). For example, the polarity of the exemplary initial wafer voltage profile 945a can be dependent upon the polarity of the first charged (activated) species 966a that are present in the exposed regions 963a, and the first charged (activated) species 966a can be positively charged as shown in FIG. 9A. The polarity of the first charged (activated) species 966a can be dependent upon the masking material in the exposed masking layer 960a.

A vector 980a is shown that can be used to represent a force on the first EPEB wafer 930a when the exemplary initial EBP voltage profile 915a and the exemplary initial wafer voltage profile 945a are established as shown in FIG. 9A. In some examples, a first capacitor ($C_a$) can be modeled using the first EPEB wafer 930a, the gap region 925a, and the first electrode 912a. In other examples, the first capacitor ($C_a$) can be modeled using the first isolation elements 920a, the gap region 925a, and the first electrode 912a.

When the exemplary initial EBP voltage profile 915a is assumed to be a first voltage ($V_{Ea}$) and the exemplary initial wafer voltage profile 945a is assumed to be a second voltage ($V_{Wa}$), the electric field (E) that exists between the first electrode 912a and the first EPEB wafer 930a can be calculated using:

$$E = \frac{V_{Ea} - V_{Wa}}{d}$$

where (E) is measured in volts/meter, and d is measured in meters (m), and electric field lines (when shown) would point from the positive charges to the negative charges.

The surface charge density can be calculated using:

$$\sigma = \frac{Q}{A}$$

where (Q) can be the total charge associated with the first electrode 912a and (A) can be the total area of the first EBP 910a.

In addition, the potential difference can be calculated using:

$$(V_{Ea} - V_{Wa}) = \frac{Qd}{\varepsilon_0 A} = \frac{Q}{C}$$

When a capacitor ($C_a$) can be modeled using the first wafer 930a and the first electrode 912a, the capacitance can be defined using:

$$C = \frac{A\varepsilon}{d}$$

where ($\varepsilon$) is the permittivity of the dielectric material between the first wafer 930a and the first electrode 912a, the area (A) can be the area of the first wafer 930a or the first electrode 912a, and (d) can be the separation distance between the first wafer 930a and the first electrode 912a.

For example, the total energy (W) stored by this "capacitive model" can be defined using:

$$W = \frac{1}{2}\frac{Q^2}{C} = \frac{1}{2}C(V_{Ea} - V_{Wa})^2 = \frac{1}{2}Q(V_{Ea} - V_{Wa})$$

where W is measured in joules and Q is the charge on the "capacitive model"

the stored energy can be calculated using:

$$W = \frac{\varepsilon_0 E^2 (Ad)}{2}$$

where W is measured in joules and (Ad) is the volume associated with the "capacitive model".

The force of attraction can be calculated using Coulomb's Law:

$$F = \frac{Q_1 Q_2}{4\pi(\varepsilon)d^2}$$

where ($Q_1$) can be illustrated using charges 945a associated with the first wafer 930a and ($Q_2$) can be illustrated using charges 915a associated with the first electrode 912a. For example, (d) can be approximated using the first gap thickness 922a and the dielectric constant ($\varepsilon$) can be approximated using ($\varepsilon_{air}$).

FIG. 9B shows a second exemplary electrostatic bake plate (EBP) 910b having a second electrode 912b that includes a plurality of negative charges 915b to represent a negative voltage profile on the second electrode 912b during the "developing" process 900b. The "developing" process 900b can occur during the "developing" times ($t_n$) in the EPEB procedure (700) and/or the EPEB teaching procedure (800).

In some embodiments, one or more second isolation elements 920b can be configured above the top of the second EBP 910b, and the second isolation elements 920b can be configured to position the second EPEB wafer 930b above the second EBP 910b. For example, isolation elements 920b can be used to form a second gap region 925b thereby isolating the second EPEB wafer 930b from the second EBP 910a during the EPEB procedure (700) and/or the EPEB teaching procedure (800). For example, the isolation elements 920b can comprise a first dielectric material, and the second gap region 925b can comprise a second dielectric material that can include air.

The second EPEB wafer 930b can comprise a second substrate layer 940b and a developed (developing) masking layer 960b that includes a developed (developing) pattern having undeveloped regions 962b and developed (developing) regions 963b, and the developed (developing) regions 963a can include a plurality of charged (acid) species 966b. For example, the developed (developing) regions 963b can include developable masking layer material that can be developed when the charged (acid) species 966b are created and moved through the developable masking layer material.

A new exemplary voltage source 970b is shown in FIG. 9B that can be used to represent the power supply subsystem (95), and can be coupled to the second electrode 912b. The new exemplary voltage source 970b can be used to represent a second "biasing" condition for the second EBP 910b and can provide an exemplary new EBP voltage profile 915b to the second electrode 912b during new processing times associated with the EPEB procedure (700) and/or during the new teaching times associated with the EPEB teaching procedure (800).

In some embodiments, the new EBP voltage profile 915b can be represented using a plurality of negative charges as shown in FIG. 9B. Alternatively, the new EBP wafer voltage profile 915b can be represented using a plurality of positive charges (not shown). For example, the polarity of the new EBP voltage profile 915b can be dependent upon the polarity of the charged (acid) species 966b that are present in the developed (developing) regions 963b, and the charged (acid) species 966b can be positively charged as shown in FIG. 9B. The polarity of the charged (acid) species 966b can be dependent upon the masking material in the developed (developing) masking layer 960b.

A new second voltage source 975b is shown in FIG. 9B that can be used to represent the power supply subsystem (95), and can be coupled to one or more of the isolation elements 920b. The new second voltage source 975b can be used to represent a new "biasing" condition for the second EPEB wafer 930b and can provide a new exemplary EBP voltage profile 945b to the second EPEB wafer 930b during new processing times associated with the EPEB procedure (700) and/or during the new teaching times associated with the EPEB teaching procedure (800). In other embodiments, the new second voltage source 975b can be coupled to the second EPEB wafer 930b and can provide a new exemplary wafer voltage profile 945b to the second EPEB wafer 930b during new processing times associated with the EPEB procedure (700) and/or during the new teaching times associated with the EPEB teaching procedure (800). In addition, the new exemplary wafer voltage profile 945b can be represented using a plurality of negative charges as shown in FIG. 9B. Alternatively, the new exemplary wafer voltage profile 945b can be represented using a plurality of positive charges (not shown). For example, the polarity of the new exemplary wafer voltage profile 945b can be dependent upon the polarity of the charged (acid) species 966b that are present in the developed (developing) regions 963b, and the charged (acid) species 966b can be positively charged as shown in FIG. 9B. The polarity of the charged (acid) species 966b can be dependent upon the masking material in the developed (developing) regions 963b.

A new vector 980b is shown in FIG. 9B that can be used to represent a new force on the new EPEB wafer 930b and the charged (acid) species 966b therein when the new exemplary EBP voltage profile 915b and the new exemplary wafer voltage profile 945b are established as shown in FIG. 9B. In some examples, a new capacitor ($C_b$) can be modeled using the new EPEB wafer 930b, the new gap region 925b, and the new electrode 912b. In other examples, the new capacitor ($C_b$) can be modeled using the new isolation elements 920b, the new gap region 925b, and the new electrode 912b.

During the EPEB teaching procedure, a plurality of new activated (acid) species 966b can be created and moved through the developable masking layer material in the developed regions 963b. For example, new voltage profiles can be established on the EBP (60, 60', or 60) to create and/or move the new activated (acid) species 966b through the developed regions 963b.

When the new exemplary EBP voltage profile 915b is assumed to be a new first voltage ($V_{Eb}$) and the new exemplary wafer voltage profile 945b is assumed to be a new second voltage ($V_{Wb}$), the electric field (E) that exists between the new electrode 912b and the new EPEB wafer 930b can be calculated using:

$$E = \frac{V_{Eb} - V_{Wb}}{d}$$

where (E) is measured in volts/meter, and d is measured in meters (m), and electric field lines (when shown) would point from the positive charges to the negative charges. In some examples, the maximum voltage that can be applied before an arcing condition occurs is about 800 volts, and the (E=1600000 volts/m)

When a new capacitor ($C_b$) can be modeled using the new wafer 930b and the new electrode 912b, the capacitance can be defined using:

$$C = \frac{A\varepsilon}{d}$$

where ($\varepsilon$) is the permittivity of the dielectric material between the new wafer 930b and the new electrode 912b, the area (A) can be the area of the new wafer 930b or the new electrode 912b, and (d) can be the separation distance between new activated (acid) species 966b in the new wafer 930b and the new electrode 912b.

For example, the total energy (W) stored by this new "capacitive model" can be defined using:

$$W = \frac{1}{2}\frac{Q^2}{C} = \frac{1}{2}C(V_{Ea} - V_{Wa})^2 = \frac{1}{2}Q(V_{Ea} - V_{Wa})$$

where W is measured in joules and Q is the charge on the new "capacitive model"

the stored energy can be calculated using:

$$W = \frac{\varepsilon_0 E^2 (Ad)}{2}$$

where W is measured in joules and (Ad) is the volume associated with the new "capacitive model".

The new force of attraction can be calculated using Coulomb's Law:

$$F_{new} = \frac{Q_1 Q_2}{4\pi(\varepsilon)d^2}$$

where ($Q_1$) can be illustrated using new charges 945b associated with the new wafer 930b and ($Q_2$) can be illustrated using new charges 915b associated with the new electrode 912b. For example, (d) can be approximated using the new gap thickness 922b and the dielectric constant ($\varepsilon$) can be approximated using ($\varepsilon_{air}$).

FIGS. 10A-10C illustrate exemplary data items in accordance with embodiments of the invention. FIG. 10A illustrates a simplified block diagram of an exemplary system 1000 that comprises an exemplary electrode 1010, a first dielectric layer 1020, a second dielectric layer 1030, and a wafer layer 1040. In addition, a voltage source 1050 is shown coupled to the exemplary electrode 1010 and the wafer layer 1040, and an exemplary capacitor 1060.

FIG. 10B illustrates an exemplary graph 1070 for the exemplary RC circuit shown in FIG. 10C, and includes an exemplary charging current curve 1072 and an exemplary charging voltage curve 1074. When the voltage source 1050 provides a voltage ($V_b$) to the exemplary RC circuit shown in FIG. 10C, the charge on the capacitor 1060 can be determined using:

$$Q = CV_{b[1-e^{-t/RC}]}$$

The charging current for the capacitor 1060 can be determined using:

$$I = \frac{V_b}{R}e^{-t/RC}$$

The voltage ($V_b$) can also be calculated using $$V_b = V_R + V_C$$

and $$V_b = IR + \frac{Q}{C}$$

Figure 11A:
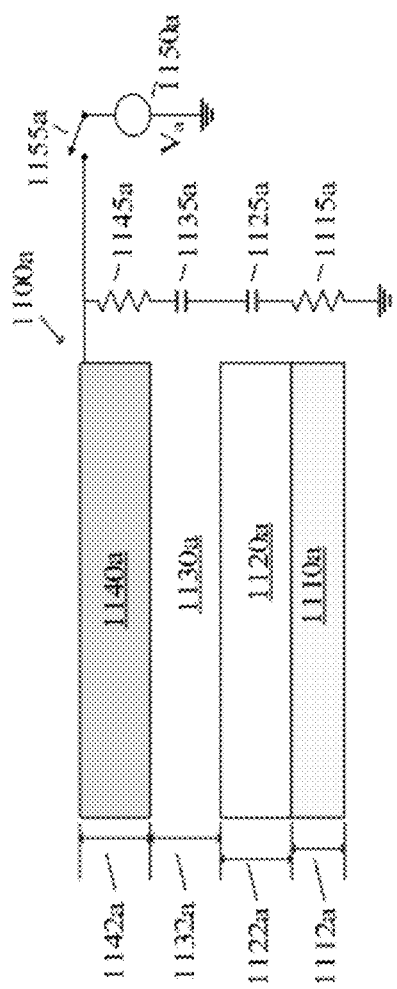
Figure 11B:
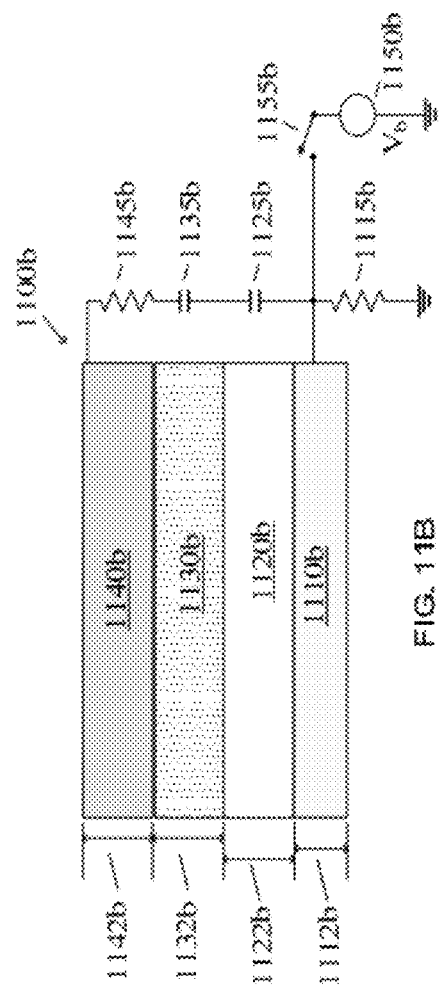

FIGS. 11A-11B illustrate exemplary block diagrams in accordance with embodiments of the invention. FIG. 11A illustrates a first simplified block diagram of an exemplary system 1100a that comprises an exemplary electrode 1110a, a first dielectric layer 1120a, a second dielectric layer 1130a, and a wafer layer 1140a, and the exemplary electrode 1110a has a thickness 1112a, the first dielectric layer 1120a has a thickness 1122a, the second dielectric layer 1130a has a thickness 1132a, and the wafer layer 1140a has a thickness 1142a. In some examples, the exemplary electrode 1110a can have a resistance 1115a associated therewith that can be dependent on the thickness 1112a, the first dielectric layer 1120a can have a capacitance ($C_{film}$) 1125a associated therewith that can be dependent on the thickness 1122a, the second dielectric layer 1130a can have a capacitance ($C_{air}$) 1135a associated therewith that can be dependent on the thickness 1132a, and the wafer layer 1140a can have a resistance 1145a associated therewith that can be dependent on the thickness 1142a.

A voltage source 1150a is shown coupled to a switch 1155a, and the switch 1155a can be coupled to the exemplary wafer layer 1140a, and an exemplary resistor 1142a. In some examples, the switch 1115a can be "closed" during a first portion of an EPEB procedure, and the switch 1115a can be "opened" during a second portion of the EPEB procedure to establish new voltage profiles. The voltage source 1155a can provide positive DC voltages, negative DC voltages, and/or AC voltages. Alternatively, the voltage source 1155a and/or the switch 1155a can be coupled differently.

In various systems, the thickness 1112a can vary from about 5 millimeter (mm) to about 20 mm, the thickness 1122a can vary from about 0.05 mm to about 0.2 mm, the thickness 1132a can vary from about 0.5 mm to about 2 mm, and the thickness 1142a can vary from about 10 nanometer (nm) to about 100 nm. In addition, the dielectric constant for first dielectric layer 1120a can be about (9.72) when SiC is assumed to be the dielectric, and the dielectric constant for second dielectric layer 1130a can be about (1) when "air" is assumed to be the dielectric. An "RC" circuit can be modeled using the resistance 1115a, the capacitance ($C_{film}$) 1125a, the capacitance ($C_{air}$) 1135a, and the resistance 1145a.

For example, the resistance 1115a can be determined using the conductance and the thickness 1112a of the exemplary electrode 1110a, and the resistance 1145a can be determined using the conductance and the thickness 1142a of the exemplary wafer layer 1140a. In addition, the capacitance ($C_{film}$) 1125a can be determined using the dielectric constant and the thickness 1122a of the first dielectric layer 1120a covering the exemplary electrode 1110a, and the capacitance ($C_{air}$) 1135a can be determined using the dielectric constant (air=1) and the thickness 1132a of the second dielectric layer 1130a between the exemplary wafer layer 1140a and the exemplary electrode 1110a, The total capacitance can be calculated using:

$$C_{total} = \frac{C_{air} C_{film}}{C_{air} + C_{film}}$$

where $$C_{air} = \frac{\varepsilon_0 S}{d_{air}}$$

and $$C_{film} = \frac{(\varepsilon_{film}) S}{d_{film}}$$

and where
 $\varepsilon_0$: dielectric constant of vacuum (air)
 $\varepsilon_{film}$: dielectric constant of film
 S: Surface area The total capacitance can vary from about 2500 picofarads (pf) to about 3500 pf, and this total capacitance can be defined as a measure of a material's ability to hold charge when a voltage is applied across the material, and a capacitor can be modeled by a dielectric layer configured between two electrodes as shown in FIG. 11A. When a voltage V is applied across these two electrodes, these parallel conductive plates can be modeled as a capacitor having a capacitance C, and the charge Q that the two electrodes can hold is directly proportional to the voltage V applied to the two electrodes. For example, the capacitance can be measured using the farad (coulomb per volt).

FIG. 11B illustrates a second simplified block diagram of a second exemplary system 1100b that comprises an exemplary electrode 1110b, a first dielectric layer 1120b, a second dielectric layer 1130b, and a wafer layer 1140b, and the exemplary electrode 1110b has a thickness 1112b, the first dielectric layer 1120b has a thickness 1122b, the second dielectric (spacer) layer 1130b has a thickness 1132b, and the wafer layer 1140b has a thickness 1142b.

In various systems, the thickness 1112b can vary from about 5 millimeter (mm) to about 20 mm, the thickness 1122b can vary from about 0.05 mm to about 0.2 mm, the thickness 1132b can vary from about 0.5 mm to about 2 mm, and the thickness 1142b can vary from about 10 nanometer (nm) to about 100 nm. In addition, the dielectric constant for first dielectric layer 1120b can be about (9.72) when SiC is assumed to be the dielectric, and the dielectric constant for second dielectric layer 1130b can be (>1) when "air" is not assumed to be the dielectric.

In some examples, the exemplary electrode 1110b can have a resistance 1115b associated therewith that can be dependent on the thickness 1112b, the first dielectric layer 1120b can have a capacitance ($C_{film}$) 1125b associated therewith that can be dependent on the thickness 1122b, the second dielectric (spacer) layer 1130b can have a capacitance ($C_{spacer}$) 1135b associated therewith that can be dependent on the thickness 1132b, and the wafer layer 1140b can have a resistance 1145b associated therewith that can be dependent on the thickness 1142b.

A voltage source 1150b is shown coupled to a switch 1155b, and the switch 1155b can be coupled to the exemplary electrode 1110b, the exemplary resistor 1115b, and the exemplary resistor 1125b. In some examples, the switch 1115a can be "closed" during a first portion of an EPEB procedure, and the switch 1115a can be "opened" during a second portion of the EPEB procedure to establish new voltage profiles. The voltage source 1155b can provide positive DC voltages, negative DC voltages, and/or AC voltages. Alternatively, the voltage source 1155b and/or the switch 1155b can be coupled differently.

An "RC" circuit can be modeled using the resistance 1115b, the capacitance ($C_{film}$) 1125b, the capacitance ($C_{spacer}$) 1135b, and the resistance 1145b. For example, the resistance 1115b can be determined using the conductance and the thickness 1112b of the exemplary electrode 1110b, and the resistance 1145b can be determined using the conductance and the thickness 1142b of the exemplary wafer layer 1140b. In addition, the capacitance ($C_{film}$) 1125b can be determined using the dielectric constant and the thickness 1122b of the first dielectric layer 1120a covering the exemplary electrode 1110a, and the capacitance ($C_{spacer}$) 1135b can be determined using the dielectric constant of the spacer material (when used) and the thickness 1132b of the (spacer) layer 1130b between the exemplary wafer layer 1140b and the exemplary electrode 1110b. In some examples, a charging time can be calculated for the "RC" circuit using:

$$\tau = RC$$

where R is dependent on the wafer resistance, and if the wafer resistance is uniform the charging time across the wafer will be uniform. For example, R can be about 4000000 ohms; C can be about 3000 pf; and RC is about (0.012) sec. In addition. The EPEB procedures can vary from about 30 sec to about 60 sec.

The total capacitance can be calculated using:

$$C_{total} = \frac{C_{spacer} C_{film}}{C_{spacer} + C_{film}}$$

where $$C_{spacer} = \frac{(\varepsilon_{spacer}) S}{d_{spacer}}$$

and $$C_{film} = \frac{(\varepsilon_{film}) S}{d_{film}}$$

and where $\varepsilon_{spacer}$: dielectric constant of spacer material (when used)
$\varepsilon_{film}$: dielectric constant of film
S: Surface area The total capacitance can vary from about 2500 picofarads (pf) to about 3500 pf, and this total capacitance can be defined as a measure of a material's ability to hold charge when a voltage is applied across the material, and a capacitor can be modeled by a dielectric layer configured between two electrodes as shown in FIG. 11B. When a voltage V is applied across these two electrodes, these parallel conductive plates can be modeled as a capacitor having a capacitance C, and the charge Q that the two electrodes can hold is directly proportional to the voltage V applied to the two electrodes. For example, the capacitance can be measured using the farad (coulomb per volt).

FIGS. 12A-12C illustrate exemplary simplification steps in accordance with embodiments of the invention. FIG. 12A illustrates a first simplified block diagram of an exemplary system 1200a that comprises an exemplary electrode 1210a, a first dielectric layer 1220a, a second dielectric layer 1230a, and a wafer layer 1240a, and the exemplary electrode 1210a has a thickness 1212a, the first dielectric layer 1220a has a thickness 1222a, the second dielectric layer 1230a has a thickness 1232a, and the wafer layer 1240a has a thickness 1242a. In some examples, the exemplary electrode 1210a can have a resistance 1215a associated therewith that can be dependent on the thickness 1212a, the first dielectric layer 1220a can have a capacitance ($C_A$) 1225a associated therewith that can be dependent on the thickness 1222a, the second dielectric layer 1230a can have a capacitance ($C_B$) 1235a associated therewith that can be dependent on the thickness 1232a, and the wafer layer 1240a can have a resistance 1245a associated therewith that can be dependent on the thickness 1242a.

A voltage source 1250a is shown coupled to a switch 1255a, and the switch 1255a can be coupled to the exemplary wafer layer 1240a. In some examples, the switch 1255a can be "closed" during a first portion of an EPEB procedure, and the switch 1255a can be "opened" during a second portion of the EPEB procedure to establish new voltage profiles. The voltage source 1250a can provide positive DC voltages, negative DC voltages, and/or AC voltages. Alternatively, the voltage source 1250a and/or the switch 1255a can be coupled differently.

In various systems, the thickness 1212a can vary from about 5 millimeter (mm) to about 20 mm, the thickness 1222a can vary from about 0.05 mm to about 0.2 mm, the thickness 1232a can vary from about 0.5 mm to about 2 mm, and the thickness 1242a can vary from about 10 nanometer (nm) to about 100 nm. In addition, the dielectric constant for first dielectric layer 1220a can be about (9.72) when SiC is assumed to be the dielectric, and the dielectric constant for second dielectric layer 1230a can be about (1) when "air" is assumed to be the dielectric.

In FIG. 12B, an "RC" circuit can be modeled using a plurality of resistors ($r_1$, $r_2$, $r_3$, $-r_n$), a plurality of first capacitors ($c_{1a}$, $c_{2a}$, $c_{3a}$, $-c_{na}$), and a plurality of second capacitors ($c_{1b}$, $c_{2b}$, $c_{3b}$, $-c_{nb}$).

In FIG. 12C, another "RC" circuit can be modeled using a resistor (R) that is the sum of the plurality of resistors ($r_1$, $r_2$, $r_3$, $-r_{na}$), using a first capacitor ($C_A$) that is the sum of the plurality of first capacitors ($c_{1a}$, $c_{2a}$, $c_{3a}$, $-c_{na}$), and using a second capacitor ($C_B$) that is the sum of the plurality of second capacitors ($c_{1b}$, $c_{2b}$, $c_{3b}$, $-c_{nb}$). In some examples, the resistor can be calculated using:

$$R = \rho \frac{l}{wt} = \frac{\rho}{t} \frac{l}{w} = R_{sheet} \frac{l}{w}$$

where
R: Resistance ($\Omega$)
p: Volume resistance ($\Omega$m)
$R_{Sheet}$: Sheet resistance ($\Omega$)
l: Length of sample (m)
t: Thickness of sample (m)
w: Width of sample (m)

The electric field (E) can be calculated using:

$$E = \frac{\sigma}{\varepsilon_{resist}}$$

($\sigma$) can be defined as the wafer surface charge density and ($\varepsilon_{resist}$) can be defined as the dielectric constant of the resist. ($\varepsilon_0$), and ($\sigma$) is measured in coulombs per square meter (C/m$^2$).

The wafer surface charge density ($\sigma$) can be determined using:

$$\sigma = \frac{Q}{S}$$

where (S) can be defined as the area of the wafer
The force on the resist can be calculated using:

$$F = q_{acid}(E)$$

where ($q_{acid}$) is the charge associated with the acid in the resist.

It is well known that the force (F) acting on the point charges ($q_1$) and ($q_2$) can be determined by the following:

$$F = k_e \frac{q_1 q_2}{r^2}$$

where (r) is the separation distance, and ($k_e$) is proportionality constant known as the Coulomb constant:

$$k_e = \frac{1}{4\pi\varepsilon_0} = \frac{c^2 \mu_0}{4\pi}$$

where (c) is the speed of light, ($\mu_0$) is the magnetic constant and $\varepsilon_0$ is the electric constant.

Controller 99 may be coupled to a processing system controller that is configured in the coating/developing processing system 1 and that can be configured to provide data to the EPEB processing systems (400a and 400b) during the EPEB procedure. The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can include uniformity data.

Controller 99 can determine and/or control the exhaust gasses from the EPEB subsystem 50 using the measuring devices 85 and/or the exhaust subsystem 97 to establish one or more exhaust gas profiles for each wafer during the EPEB procedures. For example, controller 99 may use feed-forward data from the previously developed wafer to adjust the temperature of the current wafer, and can compare the current EPEB exhaust gas data to EPEB exhaust gas data received from previously developed wafers. In addition, the exhaust gas data, the temperature data, the defect data, the particle data, and/or the metrology data used by the controller 99 can be dependent upon the types of deposited masking layer materials used on the coated wafers.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative system and methods, and illustrative examples shown and described. Accordingly, departures may be made from such details without departing from the scope of applicants' general inventive concept.

What is claimed is:

1. A method of processing a wafer using an Electrostatic Post Exposure Bake (EPEB) procedure, the method comprising:
    transferring an EPEB wafer to an Electrostatic Bake Plate (EBP) in a processing chamber in an EPEB subsystem, wherein the EPEB wafer comprises an exposed masking layer having unexposed regions and exposed regions therein;
    establishing initial processing voltage data for at least one of the EBP and the EPEB wafer during a pre-processing time in the EPEB procedure;
    obtaining initial measured voltage (IMV) data for at least one of the EBP and the EPEB wafer during the pre-processing time in the EPEB procedure;
    comparing the initial measured voltage (IMV) data to initial processing limits established for the EPEB wafer during the pre-processing time in the EPEB procedure;
    continuing to process the EPEB wafer if the initial measured voltage (IMV) data does not exceed at least one of the initial processing limits established for the EPEB wafer; and
    stopping the EPEB procedure if the initial measured voltage (IMV) data exceeds one or more of the initial processing limits established for the EPEB wafer.

2. The method of claim 1, wherein continuing to process the EPEB wafer further comprises:
    establishing new processing voltage data for at least one of the EBP and the EPEB wafer during a processing time in the EPEB procedure;
    obtaining new measured voltage (NMV) data for at least one of the EBP and the EPEB wafer during the processing time in the EPEB procedure;
    comparing the new measured voltage (NMV) data to new processing limits established for the EPEB wafer during the processing time in the EPEB procedure;
    continuing to process the EPEB wafer if the new measured voltage (NMV) data does not exceed at least one of the new processing limits established for the EPEB wafer; and
    stopping the EPEB procedure if the new measured voltage (NMV) data exceeds one or more of the new processing limits established for the EPEB wafer.

3. The method of claim 1, wherein establishing the initial processing voltage data further comprises:
    configuring a plurality of lift pins at a first position during a first pre-processing time ($t_{p1}$);
    transferring the EPEB wafer to a transfer position on top of the plurality of lift pins;
    establishing a first pre-processing voltage (EBPV$_1$) on the EBP during the first pre-processing time ($t_{p1}$), wherein the EBP comprises an electrode that is configured to provide the first pre-processing voltage (EBPV$_1$); and establishing first wafer voltage (WV$_1$) on the EPEB wafer, when the EPEB wafer is at the transfer position during the first pre-processing time (t$_{p1}$), wherein at least one of the plurality of lift pins is at a first potential.

4. The method of claim 3, wherein establishing the initial processing voltage data further comprises:
configuring the plurality of lift pins at a second position below a plurality of small wafer supports during a second pre-processing time (t$_{p2}$);
transferring the EPEB wafer to a processing position on top of the small wafer supports;
establishing a second pre-processing voltage (EBPV$_2$) on the EBP during the second pre-processing time (t$_{p2}$), wherein the electrode is configured to provide the second pre-processing voltage (EBPV$_2$); and
establishing a second wafer voltage (WV$_2$) on the EPEB wafer, when the EPEB wafer is at the processing position during the second pre-processing time (t$_{p2}$), wherein at least one of the small wafer supports is configured to provide the second wafer voltage (WV$_2$).

5. The method of claim 1, wherein obtaining the initial measured voltage data comprises:
transferring the EPEB wafer to a processing position on top of a plurality of small wafer supports in a processing chamber during the pre-processing time;
measuring pre-processing voltage (EBPV) data on the EBP during the pre-processing time, wherein the EBP comprises an electrode that is configured to measure the pre-processing voltage (EBPV) data; and
measuring a wafer voltage (WV) on the EPEB wafer, when the EPEB wafer is at the processing position during the pre-processing time, wherein at least one of the small wafer supports is configured to measure the wafer voltage (WV).

6. The method of claim 1, wherein establishing the initial measured voltage data further comprises:
transferring the EPEB wafer to a processing position on top of a plurality of small wafer supports in the processing chamber during the pre-processing time;
establishing pre-processing voltage (EBPV) data on the EBP during the pre-processing time, wherein the EBP comprises an electrode that is configured to establish the pre-processing voltage (EBPV) data; and
establishing wafer voltage (WV) data on the EPEB wafer, when the EPEB wafer is at the processing position during the pre-processing time, wherein at least one of the small wafer supports is configured to establish the wafer voltage (WV) data.

7. The method of claim 1, further comprising:
closing the processing chamber;
establishing new processing voltage data for at least one of the EBP and the EPEB wafer during a processing time in the EPEB procedure, wherein the new processing voltage data has a polarity opposite from the initial processing voltage data;
obtaining new measured voltage (NMV) data for at least one of the EBP and the EPEB wafer during the processing time in the EPEB procedure;
comparing the new measured voltage (NMV) data to new processing limits established for the EPEB wafer during the processing time in the EPEB procedure;
continuing to process the EPEB wafer if the new measured voltage (NMV) data does not exceed at least one of the new processing limits established for the EPEB wafer; and stopping the EPEB procedure if the new measured voltage (NMV) data exceeds one or more of the new processing limits established for the EPEB wafer.

8. The method of claim 1, further comprising:
storing the initial measured voltage (IMV) data and the new measured voltage (NMV) data.

9. The method of claim 1, wherein the masking layer comprises organic material, non-organic material, radiation-sensitive material, non-radiation-sensitive material, solvent material, photoresist material, or anti-reflective coating (ARC) material, or any combination thereof.

10. A method of performing an Electrostatic Post Exposure Bake (EPEB) teaching procedure using an EPEB teaching wafer, the method comprising:
transferring the EPEB teaching wafer to an Electrostatic Bake Plate (EBP) in a processing chamber in an EPEB subsystem, wherein the EPEB teaching wafer comprises an exposed masking layer having unexposed regions and exposed regions therein;
establishing initial teaching voltage (ITV) data for at least one of the EBP and the EPEB wafer during an initial teaching time (t$_1$) in the EPEB teaching procedure;
obtaining initial measured teaching voltage (IMTV) data for at least one of the EBP and the EPEB wafer during the initial teaching time (t$_1$) in the EPEB teaching procedure;
comparing the initial measured teaching voltage (IMTV) data to initial teaching limits established for the EPEB teaching wafer during the initial teaching time (t$_1$) in the EPEB teaching procedure;
continuing to process the EPEB teaching wafer if the initial measured teaching voltage (IMTV) data does not exceed at least one of the initial teaching limits established for the EPEB teaching wafer during the initial teaching time (t$_1$), wherein the initial measured teaching voltage (IMTV) data and associated initial teaching time (t$_1$) are stored; and
establishing new initial teaching limits for the EPEB teaching wafer during the initial teaching time (t$_1$) if the initial measured voltage teaching data (IMVT) exceeds one or more of the initial teaching limits established for the EPEB teaching wafer, wherein new initial measured teaching voltage (IMTV) data is obtained during the initial teaching time (t$_1$).

11. The method of claim 10, wherein continuing to process the EPEB teaching wafer further comprises:
establishing new teaching voltage (NTV) data for at least one of the EBP and the EPEB wafer during a new teaching time (t$_n$) in the EPEB teaching procedure;
obtaining new measured teaching voltage (NMTV) data for at least one of the EBP and the EPEB wafer during the new teaching time (t$_n$) in the EPEB teaching procedure;
comparing the new measured teaching voltage (NMTV) data to new teaching limits established for the EPEB wafer during the new teaching time (t$_n$) in the EPEB teaching procedure;
continuing to process the EPEB teaching wafer if the new measured teaching voltage (NMTV) data does not exceed at least one of the new teaching limits established for the EPEB teaching wafer during the new teaching time (t$_n$), wherein the new measured teaching voltage (NMTV) data and associated new teaching time (t$_n$) are stored; and
establishing new teaching limits for the EPEB teaching wafer during the new teaching time (t$_n$) if the new measured voltage teaching data (NMVT) exceeds one or more of the new teaching limits established for the EPEB teaching wafer, wherein new measured teaching voltage (NMTV) data is obtained during the new teaching time ($t_n$).

12. The method of claim 10, wherein establishing the initial teaching voltage data further comprises:
configuring a plurality of lift pins at a first position during the initial pre-processing time ($t_1$) in the EPEB teaching procedure;
transferring the EPEB wafer to a transfer position on top of the lift pins;
establishing a first pre-processing teaching voltage (EBPTV$_1$) data on the EBP during the pre-processing time ($t_1$) in the EPEB teaching procedure, wherein the EBP comprises an electrode that is configured to provide the first pre-processing teaching voltage (EBPV$_1$) data; and
establishing first wafer teaching voltage (WV$_1$) data on the EPEB wafer, when the EPEB wafer is at the transfer position during the first pre-processing time ($t_1$), wherein at least one of the lift pins is at a first potential.

13. The method of claim 12, wherein establishing the initial teaching voltage data further comprises:
configuring a plurality of lift pins at a second position below a plurality of small wafer supports during the initial teaching time ($t_1$) in the EPEB teaching procedure;
transferring the EPEB teaching wafer to a processing position on top of the small wafer supports;
establishing a second pre-processing teaching voltage (EBPTV$_2$) on the EBP during the initial teaching time ($t_1$), wherein the electrode is configured to provide the second pre-processing voltage (EBPV$_2$); and
establishing a second wafer voltage (WV$_2$) on the EPEB wafer, when the EPEB wafer is at the processing position during the initial teaching time ($t_1$), wherein at least one of the small wafer supports is configured to provide the second wafer voltage (WV$_2$).

14. The method of claim 10, wherein obtaining the initial measured teaching voltage (IMTV) data further comprises:
transferring the EPEB teaching wafer to a processing position on top of a plurality of small wafer supports in a processing chamber during the initial teaching time ($t_1$) in the EPEB teaching procedure;
measuring pre-processing teaching voltage (EBPTV) data on the EBP during the during the initial teaching time ($t_1$), wherein the EBP comprises an electrode that is configured to measure the pre-processing teaching voltage (EBPTV) data; and
measuring a wafer teaching voltage (WTV) on the EPEB teaching wafer, when the teaching EPEB wafer is at the processing position during the pre-processing time, wherein at least one of the small wafer supports is configured to measure the wafer voltage (WV).

15. The method of claim 10, wherein establishing the initial measured teaching voltage data further comprises:
transferring the EPEB teaching wafer to a processing position on top of a plurality of small wafer supports in the processing chamber the during the initial teaching time;
establishing pre-processing teaching voltage (EBPTV) data on the EBP during the initial teaching time, wherein the EBP comprises an electrode that is configured to establish the pre-processing teaching voltage (EBPTV) data; and
establishing wafer teaching voltage (WTV) data on the EPEB teaching wafer, when the EPEB teaching wafer is at the processing position during the initial teaching time, wherein at least one of the small wafer supports is configured to establish the wafer teaching voltage (WTV) data.

16. The method of claim 10, further comprising:
closing the processing chamber;
establishing new teaching voltage data for at least one of the EBP and the EPEB teaching wafer during a teaching time in the EPEB teaching procedure, wherein the new teaching voltage data has a polarity opposite from the initial teaching voltage data;
obtaining new measured teaching voltage (NMTV) data for at least one of the EBP and the EPEB teaching wafer during the teaching time in the EPEB teaching procedure;
comparing the new measured teaching voltage (NMTV) data to new teaching limits established for the EPEB teaching wafer during the teaching time in the EPEB teaching procedure;
continuing to process the EPEB teaching wafer if the new measured teaching voltage (NMTV) data does not exceed at least one of the new teaching limits established for the EPEB teaching wafer; and
stopping the EPEB teaching procedure if the new measured teaching voltage (NMTV) data exceeds one or more of the new teaching limits established for the EPEB teaching wafer.

17. The method of claim 1, further comprising:
storing the initial measured teaching voltage (IMTV) data and the new measured teaching voltage (NMTV) data.

18. The method of claim 1, wherein the masking layer comprises organic material, non-organic material, radiation-sensitive material, non-radiation-sensitive material, solvent material, photoresist material, or anti-reflective coating (ARC) material, or any combination thereof.

* * * * *